US009039933B2

(12) United States Patent
Pan et al.

(10) Patent No.: US 9,039,933 B2
(45) Date of Patent: May 26, 2015

(54) $EU^{2+}$-ACTIVATED ALUMINATES NANOBELTS, WHISKERS, AND POWDERS, METHODS OF MAKING THE SAME, AND USES THEREOF

(75) Inventors: Zhengwei Pan, Bogart, GA (US); Feng Liu, Athens, GA (US); Xufan Li, Athens, GA (US)

(73) Assignee: University of Georgia Research Foundation, Inc., Athens, GA (US)

( * ) Notice: Subject to any disclaimer, the term of this patent is extended or adjusted under 35 U.S.C. 154(b) by 249 days.

(21) Appl. No.: 13/510,460

(22) PCT Filed: Feb. 10, 2011

(86) PCT No.: PCT/US2011/024268
§ 371 (c)(1),
(2), (4) Date: May 17, 2012

(87) PCT Pub. No.: WO2011/109145
PCT Pub. Date: Sep. 9, 2011

(65) Prior Publication Data
US 2012/0319049 A1    Dec. 20, 2012

Related U.S. Application Data

(60) Provisional application No. 61/309,140, filed on Mar. 1, 2010.

(51) Int. Cl.
*C09K 11/77* (2006.01)
*H01L 33/50* (2010.01)

(52) U.S. Cl.
CPC ........... *C09K 11/7734* (2013.01); *Y02B 20/181* (2013.01); *H01L 33/502* (2013.01)

(58) Field of Classification Search
CPC ........... C09K 11/7706; C09K 11/7734; H01L 33/502; Y02B 20/181
USPC ........ 252/301.4 R; 264/21; 977/775
See application file for complete search history.

(56) References Cited

U.S. PATENT DOCUMENTS

2005/0156496 A1* 7/2005 Takashima et al. ........... 313/237
2006/0158090 A1* 7/2006 Wang et al. ................... 313/485

FOREIGN PATENT DOCUMENTS

JP    58-213080 A    12/1983
JP    2747018 B2    2/1998

OTHER PUBLICATIONS

Schierning, et al., "The influence of lattice defects on fluorescence and phosphorescence in the europium aluminate $EuAl2O4$", 2005, Physica Status Solidi C 2(1) pp. 109-112.*

(Continued)

*Primary Examiner* — Carol M Koslow
*Assistant Examiner* — Lynne Edmondson
(74) *Attorney, Agent, or Firm* — Thomas|Horstemeyer, LLP

(57) ABSTRACT

Embodiments of the present disclosure relate to visible luminescent phosphors, visible luminescent nanobelt phosphors, methods of making visible luminescent phosphors, methods of making visible luminescent nanobelt phosphors, mixtures of visible luminescent phosphors, methods of using visible luminescent phosphors, waveguides including visible luminescent phosphors, white light emitting phosphors, and the like.

15 Claims, 20 Drawing Sheets

(56) References Cited

OTHER PUBLICATIONS

Yu et al., "The influence of some processing conditions of SrAl2IO4:Eu2+ nanoparticles produced by combustion method", 2004, Materials Letters 58, pp. 1087-1091.*

Wang et al., "Concentration quenching of Cu2+ in SrO-Al2O3:Eu phosphor", 2002, Journal of Luminescence 97, pp. 1-6.*

The International Search Report and Written Opinion dated Nov. 22, 2011.

Zorenko, et al., Radiation Measurements 42 652-656 May 2007.

Meister, et al., Radiation Measurements 42 771-774 May 2007.

Schierning, et al., Physica Status Solidi C 2(1) 109-112 Jan. 2, 2005.

The International Preliminary Report on Patentability dated Sep. 4, 2012.

* cited by examiner

EU²⁺-ACTIVATED ALUMINATES NANOBELTS, WHISKERS, AND POWDERS, METHODS OF MAKING THE SAME, AND USES THEREOF

CROSS-REFERENCE TO RELATED APPLICATIONS

This application claims priority to U.S. provisional application entitled, "Eu$^{2+}$-Activated Aluminates Nanobelts, Whiskers, and Powders, Methods of Making the Same, and Uses Thereof," having Ser. No. 61/309,140, filed on Mar. 1, 2010, which is entirely incorporated herein by reference.

GOVERNMENT SUPPORT

This invention(s) was made with government support under Grant No.: NSF DMR0955908, which was awarded by the National Science Foundation. The government has certain rights in the invention(s).

BACKGROUND

Luminescent materials, which underwent almost 100 years' research and development, are currently indispensable in many important applications including fluorescent lighting, display devices, X-ray imaging, scintillators, and biological imaging [Adv. Funct. Mater. 13: 511; Yen, W. M., Weber, M. J. *Inorganic Phosphors: Compositions, Preparation and Optical Properties.* 2003, CRC Press LLC]. The luminescent materials used in these applications are generally in the form of powders. Recently, a series of oxide and nitride luminescent materials, such as ZnO, $SnO_2$ and GaN, were made into one-dimensional (1-D) nanowires and nanobelts that can be used as the building blocks for miniaturized nanophotonic circuits [Science 305: 1269]. Such nanophotonic circuits have the functions of light creation, routing and detection, laying the ground for the fabrication of highly integrated light-based devices such as optical computers. Due to the limited optical performance of ZnO, $SnO_2$ and GaN (such as limited luminescent colors and defect-related emission), however, further development of nanowires circuitry needs new types of luminescent nanowires that should have rich luminescent colors and emit characteristic light. Rare-earth (RE)-activated phosphors with diversiform luminescence apparently meets this material need.

RE-activated phosphors are one of the most important families of luminescent materials. In RE-activated phosphors, the RE ions are usually doped into the hosts in either trivalent ($RE^{3+}$) or divalent ($RE^{2+}$) states. Most of the doped $RE^{3+}$ ions have characteristic atomic-like emission spectra, which are attributed to the $4f^n \rightarrow 4f^n$ intraconfigurational transitions, due to the well-shielded 4f shell. The $RE^{2+}$-activated phosphors, in contrast, typically exhibit broad emission bands, which are generally attributed to the parity-allowed $4f^{n-1}5d \rightarrow 4f^n$ interconfigurational transitions whose wavelengths depend strongly on the host lattice.

$RE^{2+}$-activated phosphors, particularly $Eu^{2+}$-activated phosphors, are receiving increasing attention for their tunable band-like emission and broad excitation range, as well as their many important practical applications. For example, the emissions from $Eu^{2+}$ ions in different hosts can be tuned from near-UV to red, while the excitation can be extended from blue light to even the X-ray region [Res. Rep. 23: 201]. The tunable and broad emission and excitation bands of the $Eu^{2+}$-activated phosphors could fill up the spectral gaps in the emission spectrum of current white phosphor-converted LEDs (pc-LEDs) to improve their color quality for general illumination [Proc. SPIE 3938: 30]. The defect-related charge trapping phenomenon followed by normal $4f^65d \rightarrow 4f^7$ transitions in some $Eu^{2+}$-activated phosphors has led to such important applications as information storage, long persistent luminescence, electroluminescence, and high-energy radiation detection. Besides the normal $4f^65d \rightarrow 4f^7$ transition, some $Eu^{2+}$-doped alkaline earth compounds also show an extremely broad and red-shifted anomalous emission band originated from a impurity-trapped exciton (ITE) state, which is constructed by a hole on the impurity and a trapped conduction electron on the nearby lattice sites [Phys. Rev. B 32: 8465].

SUMMARY

Embodiments of the present disclosure relate to visible luminescent phosphors, methods of making visible luminescent phosphors, mixtures of visible luminescent phosphors, methods of using visible luminescent phosphors, waveguides including visible luminescent phosphors, white light emitting phosphors, and the like.

An embodiment of the visible luminescent phosphors includes, among others, an europium aluminate phosphor having a material having the formula: $(M_zEu_{1-z}O)_x(Al_2O_3)_y$, wherein M=Ba, Sr or a combination thereof; and $0 \leq z \leq 0.99$, $1 \leq x \leq 5$, and $1 \leq y \leq 5$.

An embodiment of the method of making a phosphor nanobelt includes, among others, mixing an amount of each of $Eu_2O_3$ and $Al_2O_3$ with an amount of either of SrO or BaO, ground it with an amount of graphite powder to form a mixture; and heating the mixture to about 1350-1550° C. for about 1-3 hours under about 1-50 Torr of flowing argon to form a phosphor nanobelt.

An embodiment of the method of making a phosphor whisker, among others, includes: mixing an amount of each of $Eu_2O_3$ and $Al_2O_3$ with an amount of either of SrO or BaO, ground it with an amount of graphite powder and a catalyst selected from the group consisting of: $Fe_2O_3$, NiO, $SiO_2$, and $GeO_2$, to form a mixture; and heating the mixture to about 1350-1550° C. for about 1-3 hours under about 1-50 Torr of flowing argon to form a phosphor whisker.

An embodiment of the method of making a phosphor powder, among others, includes: mixing an amount of each of $Eu_2O_3$ and $Al_2O_3$ with an amount of either of SrO or BaO, ground with an amount of graphite powder to form a mixture; and heating the mixture alongside an amount of $Al_2O_3$ powder, to about 1350-1550° C. for about 1-3 hours under about 1-50 Torr of flowing argon to form a phosphor powder.

An embodiment of the waveguide, among others, includes: a europium aluminate phosphor having a material of formula: $(M_zEu_{1-z}O)_x(Al_2O_3)_y$, wherein M=Ba, Sr, or a combination thereof; and $0 \leq z \leq 0.99$, $1 \leq x \leq 5$, and $1 \leq y \leq 5$.

An embodiment of the white light emitting phosphor mixture, among others, includes: $(EuO)(Al_2O_3)_3$, $(EuO)(Al_2O_3)$, and $(EuO)_4(Al_2O_3)_5$.

An embodiment of the white light emitting phosphor mixture, among others, includes: $(Sr_{0.9}Eu_{0.1}O)(Al_2O_3)_3$, $(Sr_{0.9}Eu_{0.1}O)(Al_2O_3)$, and $(Sr_{0.9}Eu_{0.1}O)_4(Al_2O_3)_5$.

An embodiment of the white light emitting phosphor mixture, among others, includes: $(Ba_{0.75}Eu_{0.25}O)(Al_2O_3)_3$, $(Ba_{0.99}Eu_{0.01}O)(Al_2O_3)$, $(Ba_{0.99}Eu_{0.01}O)_4(Al_2O_3)_5$, and $(Ba_{0.75}Eu_{0.25}O)_4(Al_2O_3)_5$.

The above brief description of various embodiments of the present disclosure is not intended to describe each embodiment or every implementation of the present disclosure.

Rather, a more complete understanding of the disclosure will become apparent and appreciated by reference to the following description and claims in view of the accompanying drawings. Further, it is to be understood that other embodiments may be utilized and structural changes may be made without departing from the scope of the present disclosure.

BRIEF DESCRIPTION OF THE DRAWINGS

Further aspects of the present disclosure will be more readily appreciated upon review of the detailed description of its various embodiments, described below, when taken in conjunction with the accompanying drawings.

FIGS. 20*a* to *c* illustrate digital images of three prototype white LED packages (W1, W2 and W3) operated under forward bias current of 20 mA. FIG. 20*d* illustrates emission spectra of the three prototype white LED packages under forward bias current of 20 mA. FIG. 20*e* illustrates the chromaticity coordinates on CIE 1931 diagram.

DETAILED DESCRIPTION

Figure 1:
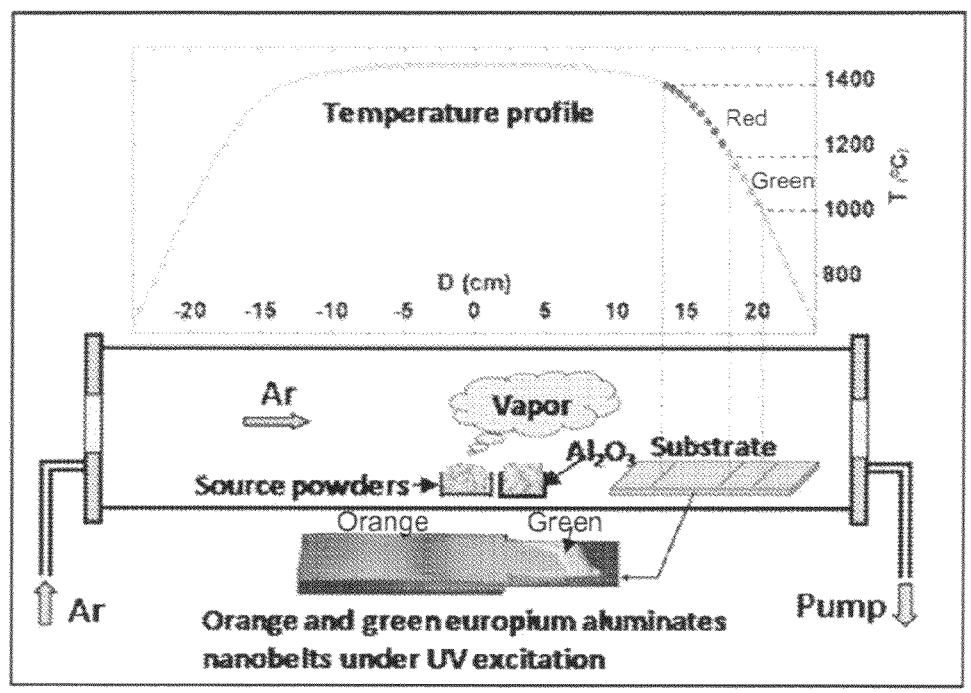
FIG. 1 is the schematic diagram of a tube furnace system used to synthesize europium aluminate, strontium europium aluminate, and barium europium aluminate, nanobelts, whiskers and powders.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, physics, and the like, which are within the skill of the art.

The following examples are put forth so as to provide those of ordinary skill in the art with a complete disclosure and description of how to perform the methods and use the probes disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

As used herein, the term "comprising," which is synonymous with "including" or "containing," is inclusive, open-ended, and does not exclude additional unrecited elements or method steps.

It must be noted that, as used in the specification and the appended claims, the singular forms "a," "an," and "the" include plural referents unless the context clearly dictates otherwise. Thus, for example, reference to "a compound" includes a plurality of compounds. In this specification and in the claims that follow, reference will be made to a number of terms that shall be defined to have the following meanings unless a contrary intention is apparent.

Discussion:

Embodiments of the present disclosure relate to visible luminescent phosphors, methods of making visible luminescent phosphors, mixtures of visible luminescent phosphors, methods of using visible luminescent phosphors, waveguides including visible luminescent phosphors, white light emitting phosphors, and the like. The visible luminescent phosphors (also referred to as "phosphors") of the present disclosure are rare-earth-activated luminescent aluminates. In particular, embodiments of the phosphors disclosed herein are $Eu^{2+}$-activated luminescent europium aluminates, $Eu^{2+}$-activated luminescent strontium europium aluminates, and $Eu^{2+}$-activated luminescent barium europium aluminates. The phosphors can be efficiently excited by a wide range of wavelengths from blue light to ultraviolet, X-ray, and to e-beam. Embodiments of the present disclosure are capable of emitting light in any visible color. The wavelength of emission can be adjusted by selectively adjusting the manufacturing parameters, such as temperature and/or pressure. In particular, the wavelength for emission bands associated with these phosphors is about 400 nm to 900 nm. The morphology of the visible luminescent phosphors can include forms such as a nanobelt, a whisker, a powder, or a combination thereof. Embodiments of the phosphors can be used in LEDs and nanophotonic circuitry (e.g., waveguides), for example.

In general, the phosphors of the present disclosure include a family of compositions generally described by: $(M_zEu_{1-z}O)_x(Al_2O_3)_y$, wherein M=Ba, Sr, or a combination thereof; and $0 \le z \le 0.99$, $1 \le x \le 5$, and $1 \le y \le 5$.

In an embodiment, the $Eu^{2+}$-activated luminescent europium aluminates (EAO) disclosed herein are $(EuO)_x(Al_2O_3)_y$, where $1 \le x \le 5$ and $1 \le y \le 5$, and in particular, x=1 or 4 and y=1, 3, or 5. Under excitation, the $Eu^{2+}$-activated luminescent europium aluminates can emit intense and broad bands in blue, green, and orange spectral regions, where the specific spectral regions can be selected by adjusting the manufacturing process. Specific embodiments of the europium aluminates can include: $(EuO)(Al_2O_3)_3$ [i.e., $EuAl_6O_{10}$], $(EuO)(Al_2O_3)$ [i.e., $EuAl_2O_4$], and $(EuO)_4(Al_2O_3)_5$ [i.e., $Eu_4Al_{10}O_{19}$]. Under excitation at room temperature, $EuAl_6O_{10}$, $EuAl_2O_4$, and $Eu_4Al_{10}O_{19}$ exhibit intense band emissions in blue (emission peak=about 425 nm, FWHM=30 nm), green (emission peak=about 525 nm, FWHM=88 nm), and orange (emission peak=about 645 nm, FWHM=153 nm) spectral regions, respectively.

In an embodiment, the $Eu^{2+}$-activated luminescent strontium europium aluminates (SEAO) disclosed herein are represented by the general formula: $(Sr_zEu_{1-z}O)_x(A_2O_3)_y$, where $0.1 \le z \le 0.99$, $1 \le x \le 5$, and $1 \le y \le 5$. Under excitation, the $Eu^{2+}$-activated luminescent strontium europium aluminates can emit intense and broad bands in blue, green, and yellow spectral regions, where the specific spectral regions can be selected by adjusting the manufacturing process. In an embodiment, the $Eu^{2+}$-activated luminescent strontium europium aluminates can include: $(Sr_{0.9}Eu_{0.1}O)(Al_2O_3)_3$, $(Sr_{0.9}Eu_{0.1}O)(Al_2O_3)$, and $(Sr_{0.9}Eu_{0.1}O)_4(Al_2O_3)_5$, with respective luminescent colors (under excitation at room temperature) of blue (emission peak=about 426 nm, FWHM=35 nm), green (emission peak=about 520 nm, FWHM=87 nm), and yellow (emission peak=about 600 nm, FWHM=144 nm).

In an embodiment, the $Eu^{2+}$-activated luminescent barium europium aluminates (BEAO) disclosed herein are represented by the general formula: $(Ba_zEu_{1-z}O)_x(Al_2O_3)_y$, where $0.1 \le z \le 0.99$, $1 \le x \le 5$, and $1 \le y \le 5$. Under excitation, the $Eu^{2+}$-activated luminescent barium europium aluminates can emit intense and broad bands in blue, green, yellow and red spectral regions, where the specific spectral regions can be selected by adjusting the manufacturing process. In an embodiment, the $Eu^{2+}$-activated luminescent barium europium aluminates can include: $(Ba_{0.75}Eu_{0.25}O)(Al_2O_3)_4$, $(Ba_{0.99}Eu_{0.01})(Al_2O_3)$, $(Ba_{0.99}Eu_{0.01}O)_4(Al_2O_3)_5$, and $(Ba_{0.75}Eu_{0.25}O)_4(Al_2O_3)_5$ with respective luminescent colors (under excitation at room temperature) of blue (emission peak=about 433 nm, FWHM=44 nm), green (emission peak=about 500 nm, FWHM=73 nm), yellow (emission peak=about 595 nm, FWHM=131 nm) and red (emission peak=732 nm, FWHM=157 nm).

In an embodiment, the $Eu^{2+}$-activated luminescent strontium europium aluminates (SEAO) disclosed herein are $(Sr_zEu_{1-z}O)_x(Al_2O_3)_y$, wherein $0.1 \le z \le 0.99$, $1 \le x \le 5$, and $1 \le y \le 5$, and in particular, z=0.9, x=1 or 4, and y=1, 3 or 5. Under excitation, the $Eu^{2+}$-activated luminescent strontium europium aluminates can emit intense and broad bands in blue, green, and yellow spectral regions, where the specific spectral regions can be selected by adjusting the manufacturing process. In an embodiment, the $Eu^{2+}$-activated luminescent strontium europium aluminates can include: $(Sr_{0.9}Eu_{0.1}O)(Al_2O_3)_3$ [i.e., $Sr_{0.9}Eu_{0.1}Al_6O_{10}$], $(Sr_{0.9}Eu_{0.1}O)(Al_2O_3)$ [i.e., $Sr_{0.9}Eu_{0.1}Al_2O_4$], and $(Sr_{0.9}Eu_{0.1}O)_4(Al_2O_3)_5$ [i.e., $Sr_{3.6}Eu_{0.4}Al_{10}O_{19}$]. Under excitation at room temperature, $Sr_{0.9}Eu_{0.1}Al_6O_{10}$, $Sr_{0.9}Eu_{0.1}Al_2O_4$, and $Sr_{3.6}Eu_{0.4}Al_{10}O_{19}$ emit intense and broadband emissions in blue (emission peak=about 426 nm, FWHM=35 nm), green (emission peak=about 520 nm, FWHM=87 nm), and yellow (emission peak=about 600 nm, FWHM=144 nm) spectral regions, respectively.

In another embodiment, $Eu^{2+}$-activated phosphors can be prepared by combining both BaO and SrO as alkaline-earth containing starting materials.

In an embodiment, the $Eu^{2+}$-activated luminescent barium europium aluminates (BEAO) disclosed herein are $(Ba_zEu_{1-z}O)_x(Al_2O_3)_y$, where $0.1 \leq z \leq 0.99$, $1 \leq x \leq 5$, and $1 \leq y \leq 5$, and in particular, $z=0.75$ or $0.99$, $x=1$ or $4$, and $y=1$, $3$ or $5$. Under excitation, the $Eu^{2+}$-activated luminescent barium europium aluminates can emit intense and broad bands in blue, green, yellow, and red spectral regions, where the specific spectral regions can be selected by adjusting the manufacturing process. In an embodiment, the barium europium aluminates can include: $(Ba_{0.75}Eu_{0.25}O)(Al_2O_3)_3$ [i.e., $Ba_{0.75}Eu_{0.25}Al_6O_{10}$], $(Ba_{0.99}Eu_{0.01}O)(Al_2O_3)$ [i.e., $Ba_{0.99}Eu_{0.01}Al_2O_4$], $(Ba_{0.99}Eu_{0.01}O)_4(Al_2O_3)_5$ [i.e., $Ba_{3.96}Eu_{0.04}Al_{10}O_{19}$], and $(Ba_{0.75}Eu_{0.25}O)_4(Al_2O_3)_5$ [i.e., $Ba_3EuAl_{10}O_{19}$]. Under excitation, $Ba_{0.75}Eu_{0.25}Al_6O_{10}$, $Ba_{0.99}Eu_{0.01}Al_2O_4$, $Ba_{3.96}Eu_{0.04}Al_{10}O_{19}$, and $Ba_3EuAl_{10}O_{19}$ emit intense and broadband emissions in blue (emission peak=about 433 nm, FWHM=44 nm), green (emission peak=about 500 nm, FWHM=73 nm), yellow (emission peak=about 595 nm, FWHM=131 nm) and red (emission peak=about 774 nm, FWHM=218 nm) spectral regions, respectively.

In an embodiment, the europium-activated luminescent nanobelts can be fabricated by a thermal evaporation-based technique in a well-controlled tube furnace system. A certain amount of the source oxides, such as $Eu_2O_3$, $Al_2O_3$, SrO, or BaO, are mixed and ground with graphite powder. The approximate ratios of the components and the approximate value of various processing conditions are described in Tables 1, 3, and 4, where approximate is equivalent to the term "about", as defined herein. The mixture is then heated in a tube (e.g., an alumina tube) at about 1350-1550° C. for about 1-3 hours under about 1-50 Torr of flowing inert gas (e.g., argon). The inert flow rate, e.g., argon flow rate, can be about 50-150 standard cubic centimeter per minute (sccm). The nanobelts are grown on the alumina substrates located at the downstream position of the processing tube. In an embodiment, the nanobelt has a rectangular cross-section. The nanobelt can have a length of about 10 micrometers to 2 millimeters, a width of about 200 to 600 nm, and a thickness of about 50 to 300 nm.

In an embodiment, the europium-activated luminescent whiskers disclosed herein are generally fabricated in the presence of a catalyst. The catalysts can include metals Fe and Ni, or semiconductors Ge and Si. Like the nanobelt, the whiskers are grown by thermal evaporation of a mixture of source oxides (e.g., $Eu_2O_3$, $Al_2O_3$, SrO, and/or BaO), catalyst oxide (e.g., $Fe_2O_3$, NiO, $SiO_2$, or $GeO_2$), and graphite powders. The approximate ratios of the components and the approximate value of various processing conditions are described in Tables 1, 3 and 4, where approximate is equivalent to the term "about", as defined herein. The whiskers are grown on the alumina substrates located at the downstream position of the alumina processing tube via a mechanism called vapor-liquid-solid (Wagner, R. S., Ellis, W. C. (1964), "Vapor-liquid-solid mechanism of single crystal growth", Appl. Phys. Lett. 4: 89). The nanowhiskers are grown on the alumina substrates located at the downstream position of the processing tube. The nanowhiskers can have a diameter of about 0.5 to 5 micrometers and length of about 0.01 to 0.5 millimeters or up to about 1 millimeter.

In an embodiment, the europium-activated luminescent powders disclosed herein are fabricated by placing additional $Al_2O_3$ powder adjacent to the mixture of source oxides (e.g., $Eu_2O_3$, $Al_2O_3$, SrO, or BaO) and graphite powders. The approximate ratios of the components and the approximate value of various processing conditions are described in Tables 1, 3, and 4, where approximate is equivalent to the term "about", as defined herein. The vapor generated from the oxide-graphite mixture reacts with $Al_2O_3$ to form the luminescent powder at the $Al_2O_3$ site.

Individually, each of the europium aluminates can be excited by a light source and then the europium aluminate emits energy at a wavelength, as mentioned above. The light source can be an e-beam (emission wavelength≤0.01 nm), an X-ray beam (about 0.01-10 nm), a vacuum-ultraviolet light source (e.g., about 112-200 nm from a deuterium lamp), an ultraviolet light source (e.g., about 250-390 nm from a xenon arc lamp), a laser beam (e.g., about 355 nm from a Nd—YAG laser or about 488 nm from an argon laser), LED (e.g., UV LED or blue LED), or a combination thereof.

When excited by an ultraviolet light (e.g., about 250-390 nm), the mixture of the three europium aluminates disclosed herein, i.e., blue-emitting $EuAl_6O_{10}$, green-emitting $EuAl_2O_4$, and orange-emitting $Eu_4Al_{10}O_{19}$, can create a D65 daylight illuminant. The D65 illuminant corresponds roughly to a mid-day sun in Western Europe and North Europe, hence it is also called a daylight illuminant. According to the International Commission on Illumination (CIE) "D65 is intended to represent average daylight and has a correlated color temperature of approximately 6500 K". In a specific embodiment, the three europium aluminates disclosed herein can therefore be used as the phosphors for white pc-LEDs.

When excited by an ultraviolet light (e.g., about 250-390 nm), the mixture of the three strontium europium aluminates, i.e., blue-emitting $Sr_{0.9}Eu_{0.1}Al_6O_{10}$, green-emitting $Sr_{0.9}Eu_{0.1}Al_2O_4$, and yellow-emitting $Sr_{3.6}Eu_{0.4}Al_{10}O_{19}$, can create a D65 daylight illuminant. In a specific embodiment, the three strontium europium aluminates disclosed herein can therefore be used as the phosphors for white LEDs in particular, pc-LEDs.

When excited by an ultraviolet light (e.g., about 250-390 nm), the mixture of the four barium europium aluminates, i.e., blue-emitting $Ba_{0.75}Eu_{0.25}Al_6O_{10}$, green-emitting $Ba_{0.99}Eu_{0.01}Al_2O_4$, yellow-emitting $Ba_{3.96}Eu_{0.04}Al_{10}O_{19}$, and red-emitting $Ba_3EuAl_{10}O_{19}$, can create a D65 daylight illuminant. In a specific embodiment, the four barium europium aluminates disclosed herein can therefore be used as the phosphors for white LEDs in particular, pc-LEDs.

When excited by a blue LED (e.g., about 430-480 nm), the yellow-emitting $Ba_{3.96}Eu_{0.04}Al_{10}O_{19}$ disclosed herein emits intense yellow light and the mixing of the blue and yellow light creates white light with color correlated temperature (CCT)<4000 K and color rendering index (CRI)>80, which is suitable for indoor illumination. The yellow-emitting $Ba_{3.96}Eu_{0.04}Al_{10}O_{19}$ disclosed herein alone can therefore be used as the phosphor for phosphor-conversion white LEDs (pc-white LEDs) in particular, for indoor illumination.

When struck by a focused e-beam, an X-ray beam, or a laser beam, intense blue, green, orange, yellow, or red light is generated and the nanobelt or whisker can function as a waveguide for the propagation and routing of the generated light. Therefore embodiments of the present disclosure can be used as the building blocks for the construction of nanophotonic circuitry.

Since the $Eu^{2+}$-activated luminescent aluminates disclosed herein can be excited by high energy sources (e.g., e-beam, X-ray and vacuum ultraviolet), the aluminates may be used as phosphors in plasma display panels and scintillating devices.

EXAMPLES

Now having described the embodiments of the present disclosure, in general, the examples describe some additional embodiments of the present disclosure. While embodiments of the present disclosure are described in connection with the examples and the corresponding text and figures, there is no intent to limit embodiments of the present disclosure to these descriptions. On the contrary, the intent is to cover all alternatives, modifications, and equivalents included within the spirit and scope of embodiments of the present disclosure.

Example 1

Method of Preparation of Luminescent Aluminates Nanobelts, Whiskers, and Powders Synthesis of luminescent nanobelts: The synthesis is based on thermal evaporation of oxide-graphite powders under controlled conditions in a well-controlled tube furnace system (See FIG. 1). The furnace system contains a high-temperature tube furnace with a maximum temperature of 1700° C., a high-purity alumina tube with OD of 1.75 inch and ID of 1.5 inch, an argon gas supply and control system, a mechanical pump, and a pressure monitoring and control system. A certain amount of oxide powders ($Eu_2O_3$, $Al_2O_3$, SrO, or BaO) are mixed and ground with a certain amount (e.g., the approximate ratios of the components and the approximate value of various processing conditions are described in Tables 1, 3, and 4, where approximate is equivalent to the term "about", as defined herein) of graphite powders. The mixture is placed in an alumina crucible that is then inserted into the center of a 1.5 inch ID alumina tube. In this tube furnace system, the temperature, alumina tube chamber pressure, gas flow rate, and evaporation time can be precisely controlled and adjusted. Several alumina plates with sizes of about 5-cm long and 1-cm wide are placed at the downstream region of the alumina tube to act as the nanobelts growth substrates. High-purity argon is used as the carrier gas. Before the heating, the alumina tube is pumped to about $2 \times 10^{-3}$ Torr. The furnace is then heated to the reaction temperature to start the growth. The preferred growth condition is as follows: furnace temperature, about 1350-1500° C.; argon flow rate, about 50-150 sccm; reaction chamber pressure, about 1-50 Torr; evaporation time, about 1-3 hours. After the reaction, the furnace is naturally cooled down to room temperature. The functions of the graphite powder are twofold: (i) carbothermal reduction of the high-melting point oxide powders to efficiently provide Eu-, Al-, Sr-, or Ba-containing species and (ii) retaining a weakly reducing environment in the reaction chamber to make Eu ions in divalent state. The function of the argon gas is to carry the oxide vapor to the downstream region. The temperature gradient profile (top inset in FIG. 1; the profile was measured when the furnace temperature is set at 1450° C.) at the furnace hearth area (the area where the growth substrates are located and growth occurs) plays a role in controlling the product morphology, compositions, crystal structures, and/or luminescence properties. For example, in growing europium aluminates nanobelts, the orange-emitting nanobelts are grown at about 1200-1400° C., while the green-emitting nanobelts are formed at about 1000-1200° C. (see the bottom inset in FIG. 1; the image was taken under a 365 nm ultraviolet lamp illumination). Moreover, the properties of the products are also determined by the growth parameters, especially the relative ratio of the source powders, the argon flow rate, and the reaction chamber pressure.

Synthesis of luminescent whiskers: The synthesis of luminescent whiskers uses the same setup as depicted in FIG. 1. The procedure and parameters are the same as those used for nanobelts synthesis, except that a small amount (e.g., about 1 mol %) of catalyst oxide powder (e.g., $Fe_2O_3$, NiO, $SiO_2$, or $GeO_2$) is mixed into the oxide-graphite mixture. The whiskers are grown on the alumina substrates. The whisker is characteristic of having a catalyst particle at its tip.

Synthesis of luminescent powders: The synthesis of luminescent powders uses the same setup as depicted in FIG. 1. The procedure and parameters are the same as those used for nanobelts synthesis, except that a certain amount (e.g., about 0.1 g) of additional $Al_2O_3$ powder is placed downstream adjacent to the oxide-graphite mixture (FIG. 1). The $Al_2O_3$ powder reacts with the vapor generated from the oxide-graphite mixture to form $Eu^{2+}$-containing luminescent powders. The formation of $Eu^{2+}$-containing aluminates powders on the $Al_2O_3$ powder site does not affect the growth of nanobelts and whiskers on the downstream alumina substrates.

Example 2

Preparation and Characterization of Europium Aluminate Nanobelts, Whiskers and Powders The europium aluminate (EAO) nanobelts are prepared by the general method of Example 1. Based on the processing conditions (Table 1), three kinds of EAO nanobelts with luminescence colors (under excitation) of blue, green, and orange are fabricated. When the $Eu_2O_3/Al_2O_3$/graphite ratios are about (0.1-1)/(0.1-0.4)/1, orange luminescent EAO nanobelts are formed in the about 1200-1400° C. region and green luminescent EAO nanobelts are grown in the about 1000-1200° C. region (FIG. 1). When more $Al_2O_3$ powder is added into the source, the growth of the orange and green luminescent EAO nanobelts are suppressed; instead, a third type of blue luminescent EAO nanobelts are grown in the whole growth region from about 1000-1400° C.

TABLE 1

Processing parameters for blue-, green-, and orange-color emitting europium aluminates nanobelts.

| Emission color | Source materials & Mass ratios ($Eu_2O_3/Al_2O_3$/graphite) | Evaporation temperature (° C.) | Pressure (Torr) | Ar flow rate (sccm) | Growth temperature (° C.) | Growth duration (hour) |
|---|---|---|---|---|---|---|
| Blue | (0.1-1)/(0.5-1)/1 | 1350-1500 | 5-50 | 50-100 | 1400-1000 | 1-3 |
| Green | (0.1-1)/(0.1-0.5)/1 | 1350-1500 | 5-50 | 50-100 | 1200-1000 | 1-3 |
| Orange | (0.1-1)/(0.1-0.5)/1 | 1350-1500 | 5-50 | 50-100 | 1400-1200 | 1-3 |

In the conditions of growing green and orange luminescent EAO nanobelts, when additional $Al_2O_3$ powder is placed adjacent to the oxide-graphite mixture, orange luminescent EAO powder is formed at the $Al_2O_3$ site. When the argon flow rate is increased to about 100-200 sccm, however, green luminescent EAO powder is formed.

Figure 2:
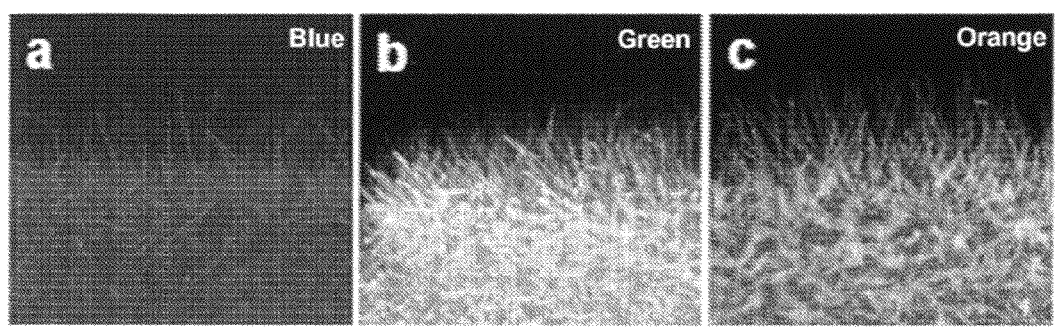
FIG. 2 shows the digital images of (a) blue, (b) green, and (c) orange luminescent europium aluminate nanobelts taken under a digital optical microscope with a 365 nm ultraviolet lamp irradiation.
Figure 3:
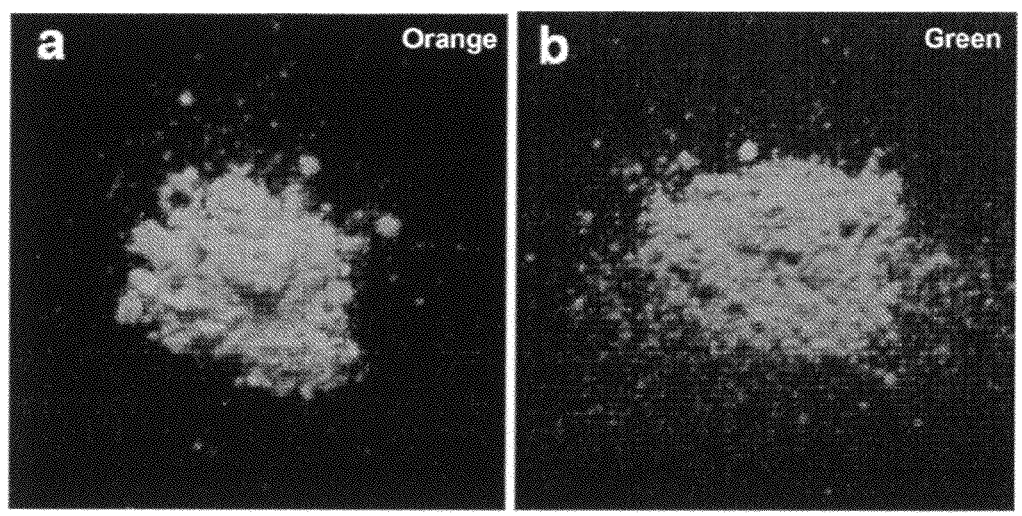
FIG. 3 shows the digital images of (a) green and (b) orange luminescent europium aluminate powders taken under a digital optical microscope with a 365 nm ultraviolet lamp irradiation.
Figure 4:
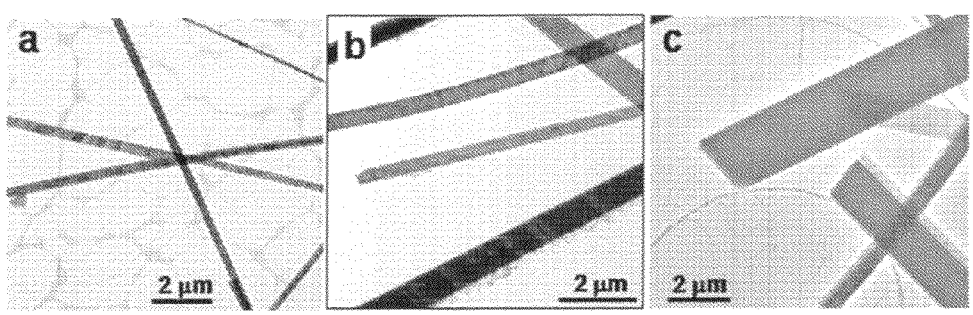
FIG. 4 shows the transmission electron microscope images of (a) blue, (b) green, and (c) orange luminescent europium aluminate nanobelts.

FIG. 2 shows the digital images of (a) blue, (b) green, and (c) orange luminescent europium aluminate nanobelts taken under a digital optical microscope with a 365 nm ultraviolet lamp irradiation. FIG. 3 shows the digital images of (a) green and (b) orange luminescent europium aluminate powders taken under a digital optical microscope with a 365 nm ultraviolet lamp irradiation. FIG. 4 shows the transmission electron microscope images of (a) blue, (b) green, and (c) orange luminescent europium aluminate nanobelts. The nanobelts have widths of about 200 to 600 nanometers, thicknesses of about 50 to 300 nm, and lengths of about 10 μm to 2 mm.

Quantitative composition analyses using a energy-dispersive X-ray spectroscope (EDS) show that the compositions of the EAO can be represented by $(EuO)_x(Al_2O_3)_y$, wherein the x and y values vary for different luminescence color products. For the blue luminescent EAO, the x and y values are 1 and 3, respectively; accordingly, the composition of the blue luminescent EAO is $(EuO)(Al_2O_3)_3$, i.e., $EuAl_6O_{10}$. For the green luminescent EAO (including nanobelts and powders), the x and y values are 1 and 1, respectively; accordingly, the composition of the green luminescent EAO is $(EuO)(Al_2O_3)$, i.e., $EuAl_2O_4$. For the orange luminescent EAO (including nanobelts and powders), the x and y values are 4 and 5, respectively; accordingly, the composition of the orange luminescent EAO is $(EuO)_4(Al_2O_3)_5$, i.e., $Eu_4Al_{10}O_{19}$.

Figure 5:
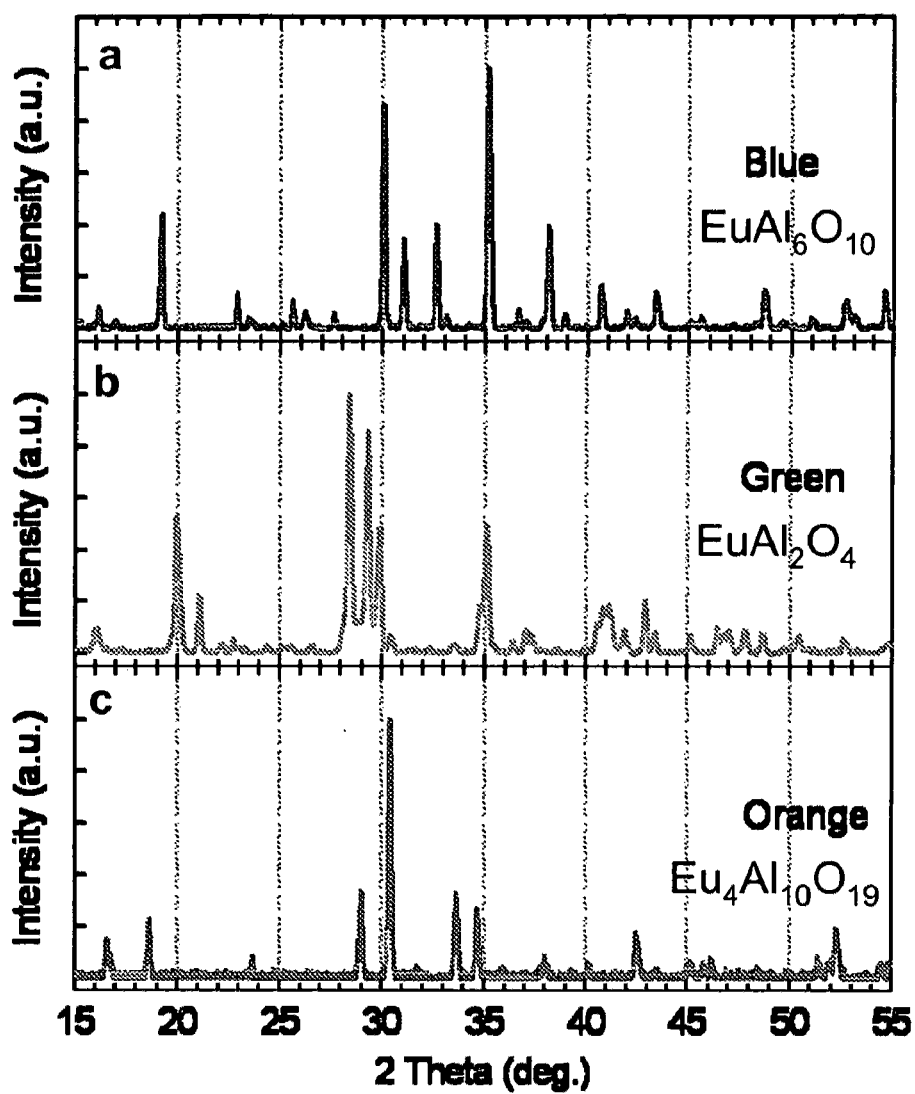
FIG. 5 shows the X-ray diffraction patterns of (a) blue luminescent $EuAl_6O_{10}$, (b) green luminescent $EuAl_2O_4$, and (c) orange luminescent $Eu_4Al_{10}O_{19}$ nanobelts and whiskers.

FIG. 5 shows the X-ray diffraction patterns of (a) blue luminescent $EuAl_6O_{10}$, (b) green luminescent $EuAl_2O_4$ (including nanobelts and powders), and (c) orange luminescent $Eu_4Al_{10}O_{19}$ (including nanobelts and powders). The green luminescent $EuAl_6O_{10}$ can be indexed using the isostructural monoclinic $SrAl_2O_4$. However, no corresponding isostructural phases are available for the blue luminescent $EuAl_6O_{10}$ and orange luminescent $Eu_4Al_{10}O_{19}$ in the ICDD (International Centre for Diffraction Data) database and other commonly available database.

Complementary structural analyses using regular X-ray diffraction, synchrotron X-ray microdiffraction, high-resolution transmission electron microscopy, and electron diffraction show that the blue luminescent $EuAl_6O_{10}$, green luminescent $EuAl_2O_4$, and orange luminescent $Eu_4Al_{10}O_{19}$ nanobelts have, respectively, tetragonal, monoclinic, and hexagonal crystal structures with new lattice parameters. Table 2 lists the structural information of the three europium aluminate nanobelts.

TABLE 2

Structural information of europium aluminate nanobelts

| Emission Color | Chemical Formula | Crystal Structures | Lattice Parameters | Growth Direction |
|---|---|---|---|---|
| Blue | $EuAl_6O_{10}$ | Tetragonal | a = b = 7.77 Å, c = 17.30 Å, α = β = γ = 90° | [110] |
| Green | $EuAl_2O_4$ | Monoclinic | a = 8.44 Å, b = 8.83 Å, c = 5.16 Å, β = 93.25° | [010] |
| Orange | $Eu_4Al_{10}O_{19}$ | Hexagonal | a = b = 6.154 Å, c = 10.57 Å, α = β = 90°, γ = 120° | [001] |

The EAO phosphors can be effectively excited by a wide range of wavelengths ranging from blue light to ultraviolet, X-ray, and to e-beam, and emit intense characteristic blue, green and orange lights of $Eu^{2+}$ ions.

Figure 6:
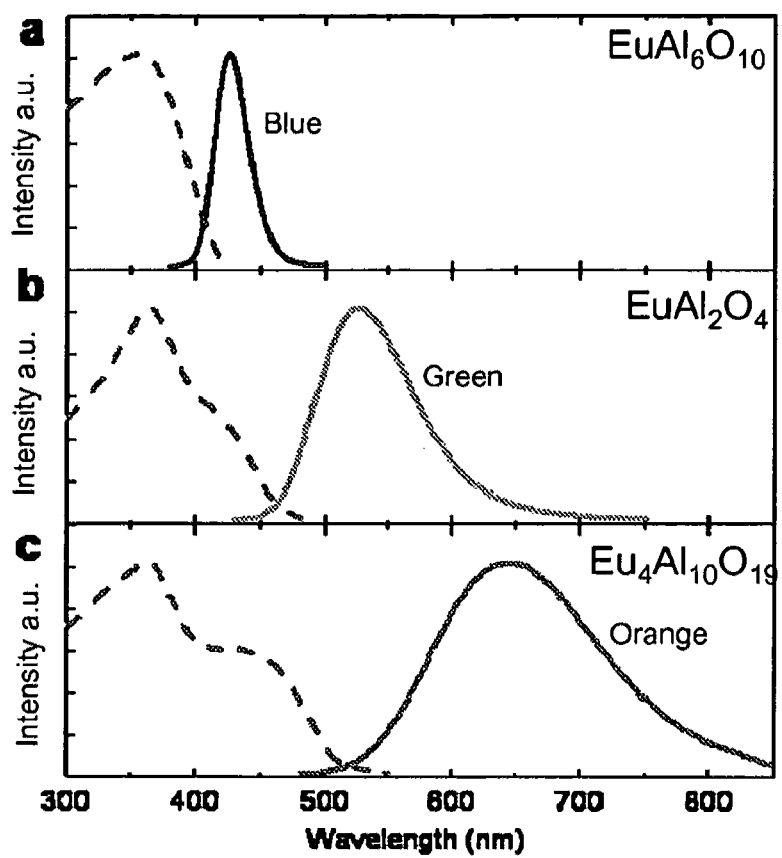
FIG. 6 shows the room-temperature excitation and emission spectra of (a) blue luminescent $EuAl_6O_{10}$, (b) green luminescent $EuAl_2O_4$, and (c) orange luminescent $Eu_4Al_{10}O_{19}$ nanobelts and powders.

FIG. 6 shows the room-temperature excitation and emission spectra of the (a) blue luminescent $EuAl_6O_{10}$, (b) green luminescent $EuAl_2O_4$, and (c) orange luminescent $Eu_4Al_{10}O_{19}$ nanobelts and powders. The emission spectra (solid line) are excited by 350 nm ultraviolet light. The excitation spectra (dashed line) are monitoring at 430 nm for blue luminescent $EuAl_4O_{10}$, 530 nm for green luminescent $EuAl_2O_4$, and 640 nm for orange luminescent $Eu_4Al_{10}O_{19}$. The blue luminescence with typical full-width at half-maximum (FWHM) is attributed to the localized $4f^65d \rightarrow 4f^7$ transition of $Eu^{2+}$ active centers. The green luminescence also originates from the $4f^65d \rightarrow 4f^7$ transition of $Eu^{2+}$ active centers but has a larger FWHM, probably due to the formation of a more delocalized $Eu^{2+}$ chain in the host. The orange luminescence, in contrast, features an unusual, extremely wide emission band and large stokes shift that are characteristic of the anomalous impurity-trapped exciton (ITE) luminescence [J. Phys.: Condens. Mater. 15: 2645].

When an individual EAO nanobelt or whisker is struck by a focused e-beam, an X-ray beam, or a laser beam, intense blue, green or orange light is generated, and the nanobelt or whisker can also function as a waveguide for the propagation and routing of the generated light.

Figure 7:
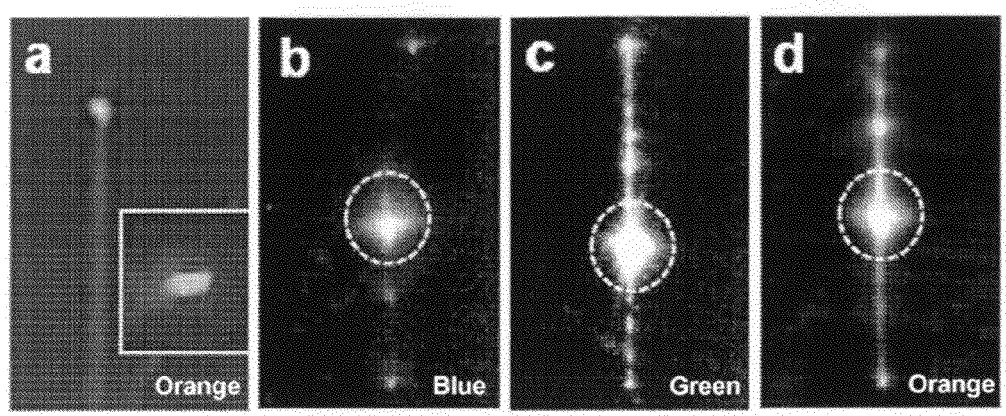
FIG. 7 shows the light generation and propagation on individual (a) orange luminescent $Eu_4Al_{10}O_{10}$ nanobelt struck by a blue laser beam, (b) blue luminescent $EuAl_6O_{10}$ nanobelt struck by a focused X-ray beam, (c) green luminescent $EuAl_2O_4$ nanobelt struck by a focused x-ray beam, and (d) orange luminescent $Eu_4Al_{10}O_{10}$ nanobelt struck by a focused x-ray beam.

FIG. 7 shows the light generation and propagation on individual (a) orange luminescent $Eu_4Al_{10}O_{10}$ nanobelt struck by a blue laser beam, (b) blue luminescent $EuAl_6O_{10}$ nanobelt struck by a focused X-ray beam, (c) green luminescent $EuAl_2O_4$ nanobelt struck by a focused X-ray beam, and (d) orange luminescent $Eu_4Al_{10}O_{10}$ nanobelt struck by a focused X-ray beam. The insert in FIG. 7a is the magnified image of the emitting tip of the nanobelts. The diameter of the X-ray beam is about 0.5 μm and the positions of the X-ray beam in FIG. 7b-d are indicated by white dashed circles. The images were taken when room light was off.

Since the emission bands of the blue, green, and orange luminescent EAO phosphors cover the whole visible region, the mixture of these three aluminates can provide phosphors for white LEDS, in particular, white light pc-LEDs.

Figure 8:
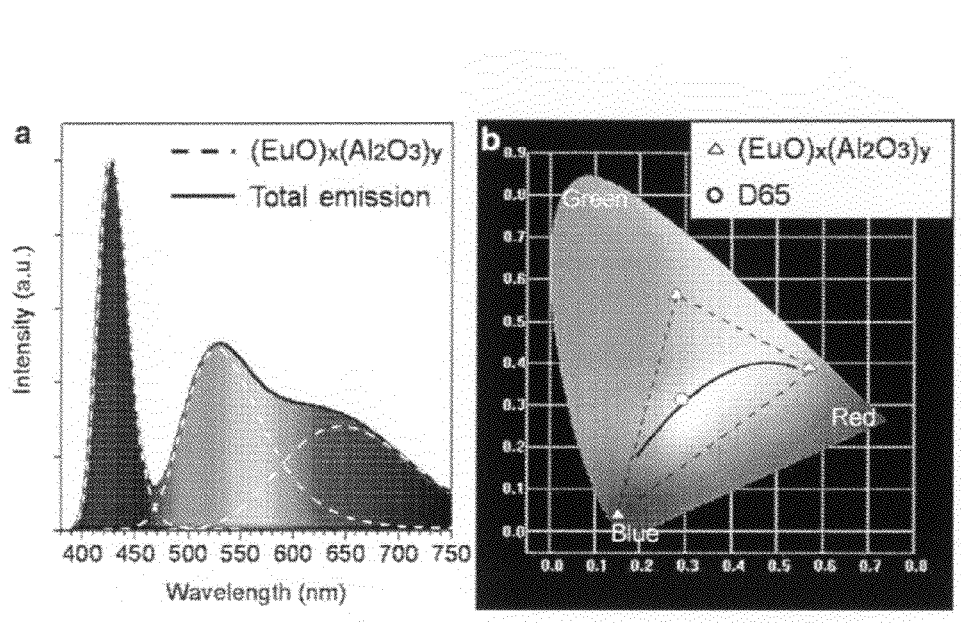
FIGS. 8A and B show the white light generated by the combination of the blue, green, and orange luminescent europium aluminates.

FIG. 8a shows the emission spectra (dashed lines) of the blue, green, and orange luminescent europium aluminates excited by 360 nm ultraviolet light, as well as the combined emission spectrum (solid line) of these three emission bands. FIG. 8b is the related CIE chromaticity diagram, in which the three open triangles respectively represent the chromaticity points of the blue, green and orange luminescent aluminates, and the open circle represents the chromaticity point of the combined emission. The position of the combined emission is perfectly superposed with the position of the standard D65 daylight illuminant which has a correlated color temperature of about 6500 K. The solid curve is the black-body radiation locus.

Example 3

Preparation and Characterization of Strontium Europium Aluminate Nanobelts, Whiskers and Powders The strontium europium aluminate (SEAO) nanobelts are prepared by the general method of Example 1. Based on the processing conditions (Table 3), three kinds of SEAO nanobelts with luminescence colors (under excitation) of blue, green, and yellow are fabricated. When the $SrO/Eu_2O_3/$ $Al_2O_3$/graphite ratios are about (0.5-1)/(0.1-1)/(0.1-0.4)/1, yellow luminescent SEAO nanobelts are formed in the about 1200-1400° C. region and green luminescent SEAO nanobelts are grown in the about 1000-1200° C. region. When more $Al_2O_3$ powder is added into the source, the growth of the orange and green luminescent nanobelts are suppressed; instead, a third type of blue luminescent SEAO nanobelts are grown in the whole growth region from about 1000-1400° C.

TABLE 3

Processing parameters for blue-, green-, and yellow-color emitting strontium europium aluminate nanobelts and whiskers.

| Emission color | Source materials & Mass ratios ($SrO/Eu_2O_3/Al_2O_3$/graphite) | Evaporation temperature (° C.) | Pressure (Torr) | Ar flow rate (sccm) | Growth temperature (° C.) | Growth duration (hour) |
| --- | --- | --- | --- | --- | --- | --- |
| Blue | (0.5-1)/(0.1-1)/(0.5-1)/1 | 1350-1500 | 5-50 | 50-100 | 1400-1000 | 1-3 |
| Green | (0.5-1)/(0.1-1)/(0.1-0.5)/1 | 1350-1500 | 5-50 | 50-100 | 1200-1000 | 1-3 |
| Yellow | (0.5-1)/(0.1-1)/(0.1-0.5)/1 | 1350-1500 | 5-50 | 50-100 | 1400-1200 | 1-3 |

In the conditions of growing SEAO nanobelts, when a small amount (e.g., about 1 mol %) of catalyst oxide such as $Fe_2O_3$, NiO, $SiO_2$, or $GeO_2$ is added into the oxide-graphite mixture, straight SEAO whiskers will be grown with Fe, Ni, Si, or Ge as the catalyst.

In the conditions of growing green and yellow luminescent SEAO nanobelts, when additional $Al_2O_3$ powder is placed adjacent to the oxide-graphite mixture, yellow luminescent SEAO powder is formed at the $Al_2O_3$ site. When the argon flow rate is increased to about 100-200 sccm, however, green luminescent SEAO powder is formed.

Figure 9:
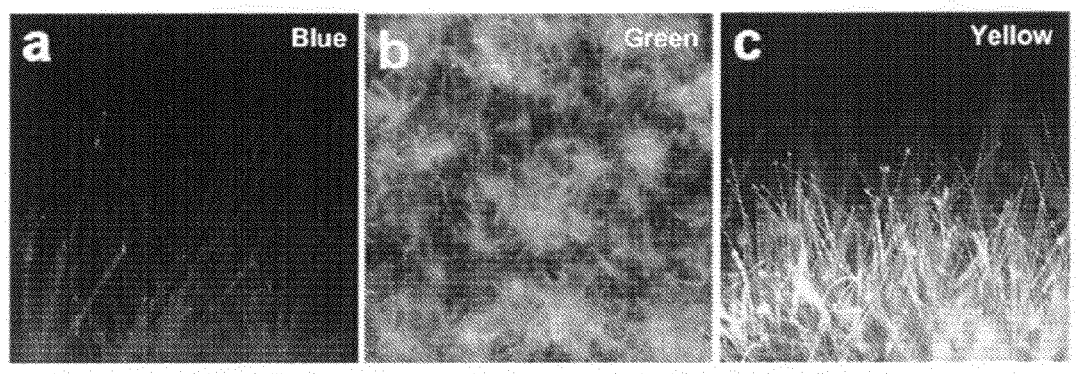
FIG. 9 shows the digital images of (a) blue, (b) green, and (c) yellow luminescent strontium europium aluminate nanobelts taken under a digital optical microscope with a 365 nm ultraviolet lamp irradiation.

FIG. 9 shows the digital images of (a) blue, (b) green, and (c) yellow luminescent strontium europium aluminate nanobelts taken under a digital optical microscope with a 365 nm ultraviolet lamp irradiation.

Figure 10:
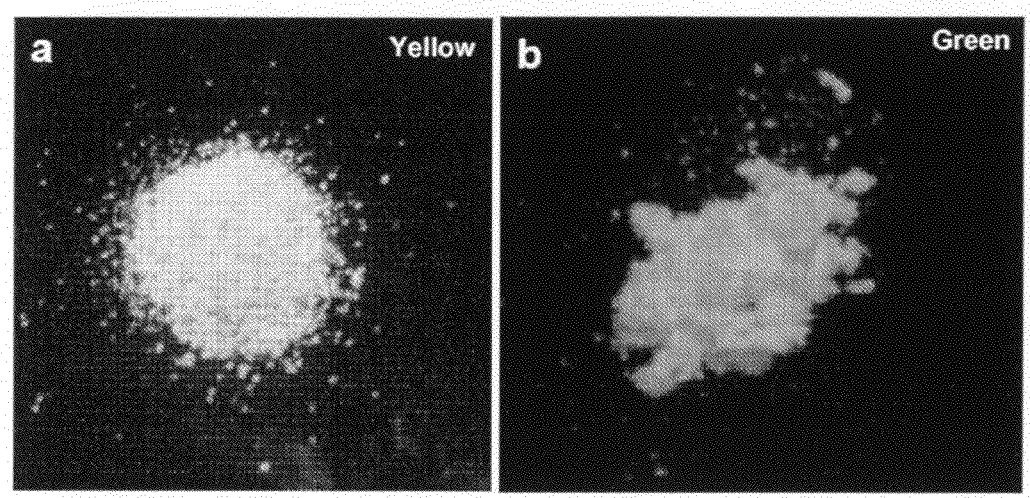
FIG. 10 shows the digital images of (a) yellow and (b) green luminescent strontium europium aluminate powders taken under a digital optical microscope with a 365 nm ultraviolet lamp irradiation.

FIG. 10 shows the digital images of (a) green and (b) yellow luminescent strontium europium aluminate powders taken under a digital optical microscope with a 365 nm ultraviolet lamp irradiation.

Figure 11:
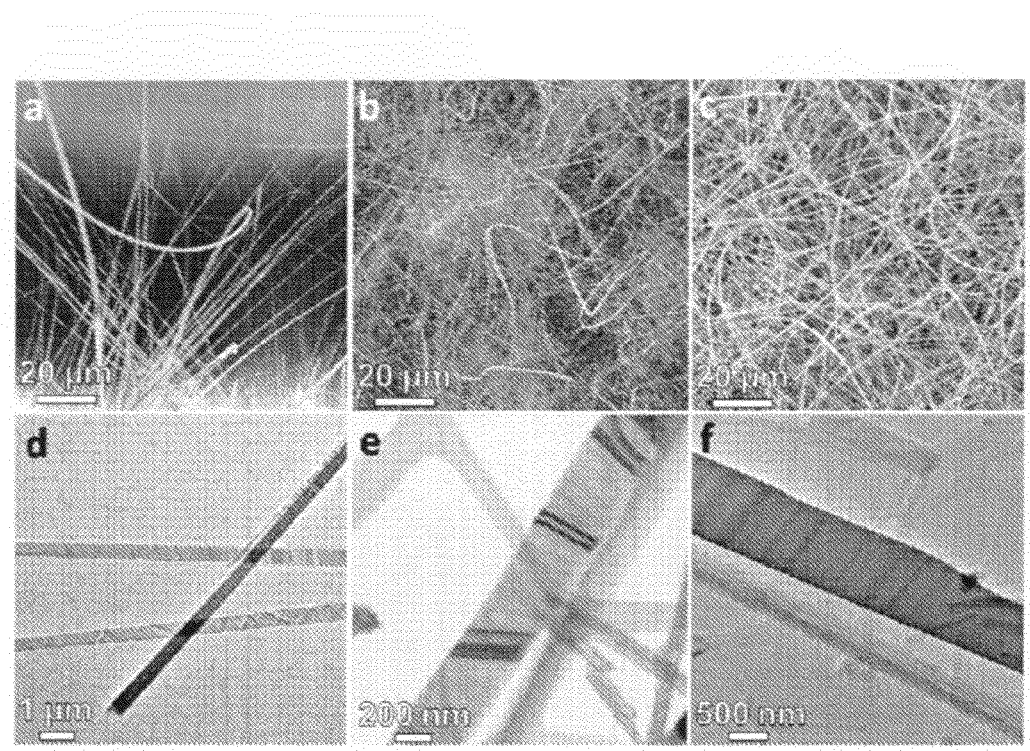
FIG. 11 shows the scanning electron microscope images of (a) blue, (b) green and (c) yellow luminescent strontium europium aluminate nanobelts and the transmission electron microscope images of (d) blue, (e) green and (f) yellow luminescent strontium europium aluminate nanobelts.

FIG. 11 shows the scanning electron microscope images of (a) blue, (b) green and (c) yellow luminescent strontium europium aluminate nanobelts and the transmission electron microscope images of (d) blue, (e) green and (f) yellow luminescent strontium europium aluminate nanobelts. The nanobelts have widths of about 200 to 600 nanometers, thicknesses of about 50 to 300 nm, and lengths of about 10 μm to 2 mm.

Figure 12:
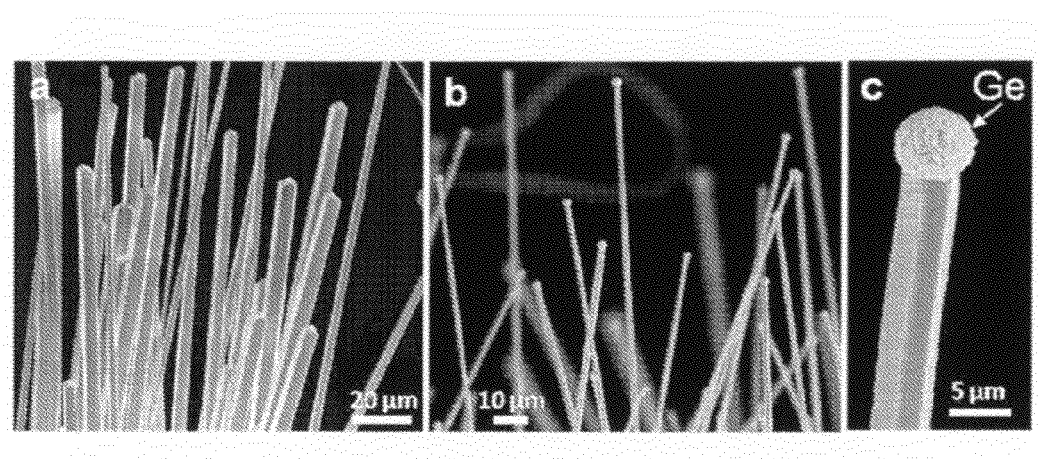
FIG. 12 shows the scanning electron microscope images of Ge-catalyzed (a) blue and (b, c) yellow luminescent strontium europium aluminate whiskers.

FIG. 12 shows the scanning electron microscope images of Ge-catalyzed (a) blue and (b, c) yellow luminescent strontium europium aluminate whiskers. The morphological feature of the catalytically grown whiskers is that each whisker terminates with a catalyst particle (see FIG. 12c). The whiskers have diameters of about 0.5 to 5 μm and length of up to about 1 mm.

Quantitative composition analyses using a energy-dispersive X-ray spectroscope (EDS) show that the compositions of the SEAO phosphors can be represented by $(Sr_zEu_{1-z}O)_x(Al_2O_3)_y$, wherein z is a value of around 0.9 and the x and y values vary for different luminescence color products. For the blue luminescent SEAO, the x and y values are 1 and 3, respectively; accordingly, the composition of the blue luminescent SEAO is $(Sr_{0.9}Eu_{0.1}O)(Al_2O_3)_3$, i.e., $Sr_{0.9}Eu_{0.1}Al_6O_{10}$. For the green luminescent SEAO (including nanobelts and powders), the x and y values are 1 and 1, respectively; accordingly, the composition of the green luminescent SEAO is $(Sr_{0.9}Eu_{0.1}O)(Al_2O_3)$, i.e., $Sr_{0.9}Eu_{0.1}Al_2O_4$.

For the yellow luminescent SEAO (including nanobelts and powders), the x and y values are 4 and 5, respectively; accordingly, the composition of the yellow luminescent SEAO is $(Sr_{0.9}Eu_{0.1}O)_4(Al_2O_3)_5$, i.e., $Sr_{3.6}Eu_{0.4}Al_{10}O_{19}$.

Figure 13:
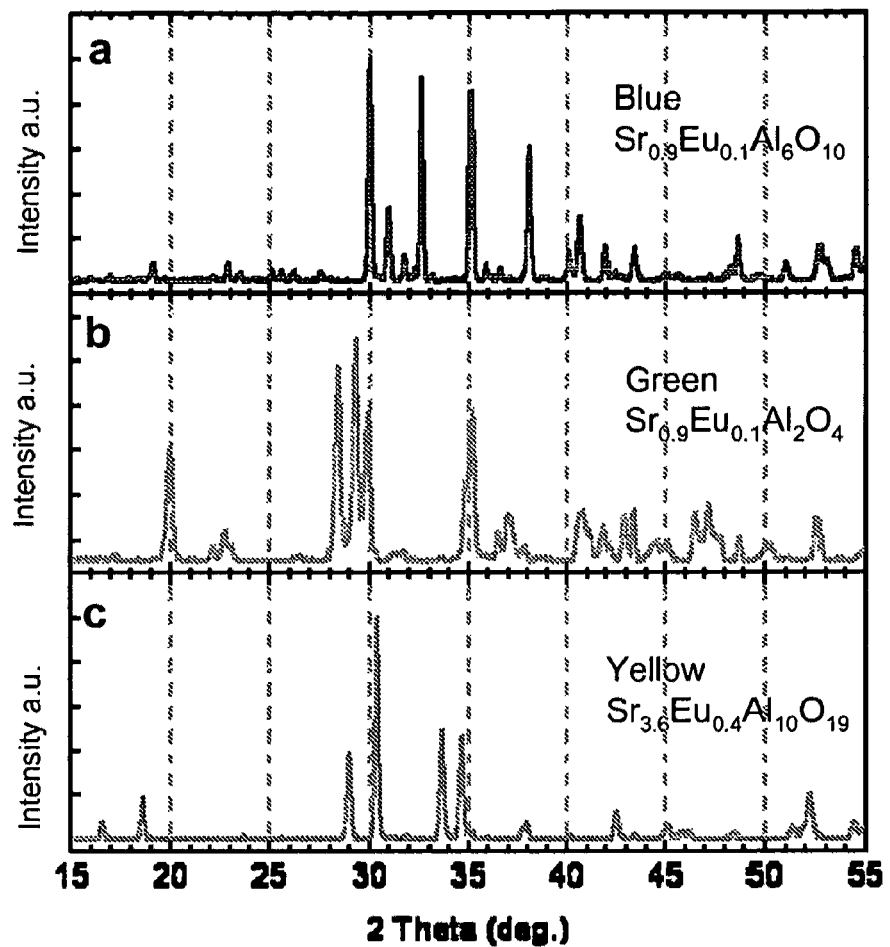
FIG. 13 shows the X-ray diffraction patterns of (a) blue luminescent $Sr_{0.9}Eu_{0.1}Al_6O_{10}$, (b) green luminescent $Sr_{0.9}Eu_{0.1}Al_2O_4$, and (c) yellow luminescent $Sr_{3.6}Eu_{0.4}Al_{10}O_{19}$, nanobelts, whiskers, and powders.

FIG. 13 shows the X-ray diffraction patterns of (a) blue luminescent $Sr_{0.9}Eu_{0.1}Al_6O_{10}$ (including nanobelts and whiskers), (b) green luminescent $Sr_{0.9}Eu_{0.1}Al_2O_4$ (including nanobelts, whiskers and powders), and (c) yellow luminescent $Sr_{3.6}Eu_{0.4}Al_{10}O_{19}$ (including nanobelts, whiskers and powders). The patterns of the blue luminescent $Sr_{0.9}Eu_{0.1}Al_6O_{10}$, green luminescent $Sr_{0.9}Eu_{0.1}Al_2O_4$, and yellow luminescent $Sr_{3.6}Eu_{0.4}Al_{10}O_{19}$ are the same as the patterns of the blue luminescent $EuAl_6O_{10}$, green luminescent $EuAl_2O_4$, and orange luminescent $Eu_4Al_{10}O_{19}$, respectively. The green luminescent $Sr_{0.9}Eu_{0.1}Al_2O_4$ can be indexed as monoclinic $SrAl_2O_4$. However, no corresponding isostructural phases are available for the blue luminescent $Sr_{0.9}Eu_{0.1}Al_6O_{10}$ and yellow luminescent $Sr_{3.6}Eu_{0.4}Al_{10}O_{19}$ in the ICDD database and other commonly available databases.

Complementary structural analyses using regular X-ray diffraction, synchrotron X-ray microdiffraction, high-resolution transmission electron microscopy, and electron diffraction show that the blue luminescent $Sr_{0.9}Eu_{0.1}Al_6O_{10}$, green luminescent $Sr_{0.9}Eu_{0.1}Al_2O_4$, and yellow luminescent $Sr_{3.6}Eu_{0.4}Al_{10}O_{19}$ nanobelts and whiskers have, respectively, tetragonal, monoclinic, and hexagonal crystal structures with new lattice parameters.

The SEAO phosphors can be effectively excited by a wide range of wavelengths ranging from blue light to ultraviolet, X-ray, and to e-beam, and emit intense characteristic blue, green and yellow lights of $Eu^{2+}$ ions.

Figure 14:
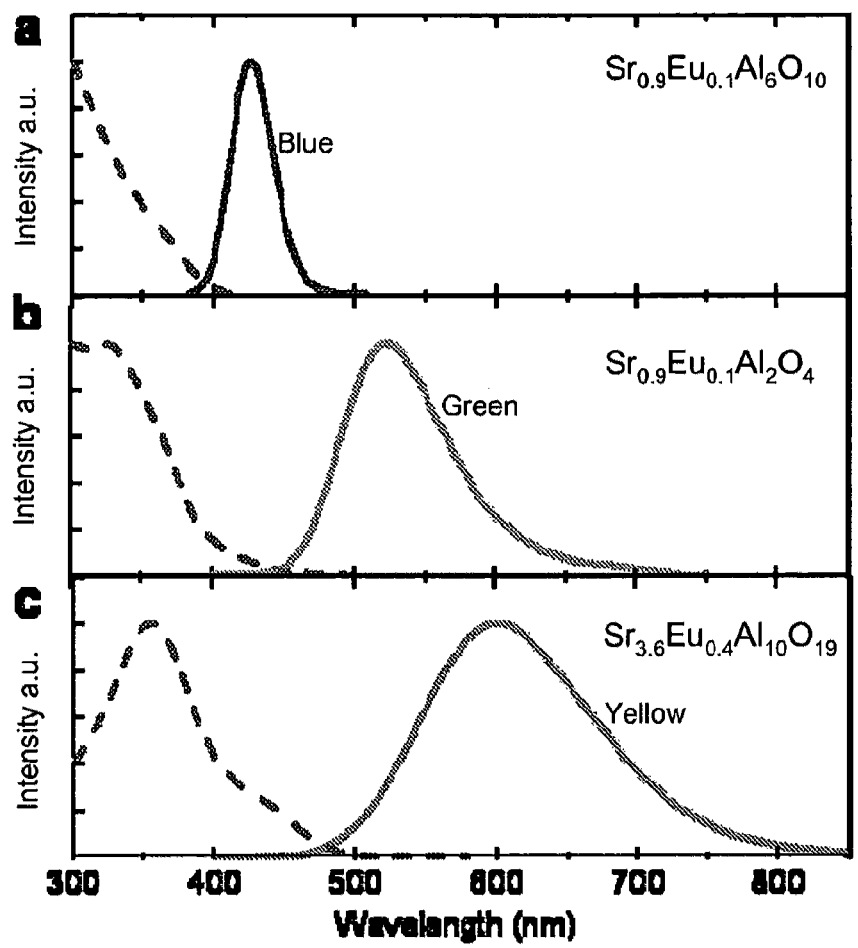
FIG. 14 shows the room-temperature excitation and emission spectra of (a) blue luminescent $Sr_{0.9}Eu_{0.1}Al_6O_{10}$, (b) green luminescent $Sr_{0.9}Eu_{0.1}Al_2O_4$, and (c) yellow luminescent $Sr_{3.6}Eu_{0.4}Al_{10}O_{19}$, nanobelts, whiskers, and powders.

FIG. 14 shows the room-temperature excitation and emission spectra of the (a) blue luminescent $Sr_{0.9}Eu_{0.1}Al_6O_{10}$, (b) green luminescent $Sr_{0.9}Eu_{0.1}Al_2O_4$, and (c) yellow luminescent $Sr_{3.6}Eu_{0.4}Al_{10}O_{19}$ nanobelts, whiskers and powders. The emission spectra (solid line) are excited by 350 nm ultraviolet light. The excitation spectra (dashed line) are monitoring at about 430 nm for blue luminescent $Sr_{0.9}Eu_{0.1}Al_6O_{10}$, about 530 nm for green luminescent $Sr_{0.9}Eu_{0.1}Al_2O_4$, and about 590 nm for yellow luminescent $Sr_{3.6}Eu_{0.4}Al_{10}O_{19}$.

Example 4

Preparation and Characterization of Barium Europium Aluminate Nanobelts, Whiskers and Powders The barium europium aluminate (BEAO) nanobelts are prepared by the general method of Example 1. The fabrication of the BEAO compounds is very sensitive to the processing parameters, especially to the chamber pressure and Ar flow rate. Based on the processing conditions (Table 4), four kinds of BEAO nanobelts with luminescence colors (under excitation) of blue, green, yellow, and red are fabricated. Under the typical conditions of BaO/Eu$_2$O$_3$/A$_2$O$_3$/graphite mass ratios of about (0.5-1)/(0.1-1)/(0.1-0.5)/1 and evaporation temperatures of about 1350-1500° C., red luminescent BEAO nanobelts are formed when pressure is about 15-50 Torr and Ar flow rate is about 50-60 sccm, yellow luminescent BEAO nanobelts are formed when pressure is about 5-10 Torr and Ar flow rate is about 60-100 sccm, and green luminescent BEAO nanobelts are formed when pressure is about 5-15 Torr and Ar flow rate is about 100-150 sccm. When more Al$_2$O$_3$ powder is added into the source, blue luminescent BEAO nanobelts are obtained under a pressure about 5-15 Torr and argon flow rate of about 50-100 sccm.

TABLE 4

Processing parameters for blue-, green-, yellow, and red-color emitting barium europium aluminate nanobelts and whiskers.

| Emission color | Source materials & Mass ratios (BaO/Eu$_2$O$_3$/Al$_2$O$_3$/graphite) | Evaporation temperature (° C.) | Pressure (Torr) | Ar flow rate (sccm) | Growth temperature (° C.) | Growth duration (hour) |
|---|---|---|---|---|---|---|
| Blue | 0.5-1/(0.1-1)/0.5-1/1 | 1350-1500 | 5-50 | 50-100 | 1400-1000 | 1-3 |
| Green | 0.5-1/(0.1-1)/0.1-0.5/1 | 1350-1500 | 5-15 | 100-150 | 1300-1000 | 1-3 |
| Yellow | 0.5-1/(0.1-1)/0.1-0.5/1 | 1350-1500 | 5-10 | 60-100 | 1300-1200 | 1-3 |
| Red | 0.5-1/(0.1-1)/0.1-0.5/1 | 1350-1500 | 15-50 | 50-60 | 1300-1000 | 1-3 |

In the conditions of growing yellow and red luminescent BEAO nanobelts, when additional Al$_2$O$_3$ powder is placed adjacent to the oxide-graphite mixture, yellow and red luminescent BEAO powders are formed at the Al$_2$O$_3$ sites, respectively.

Figure 15:
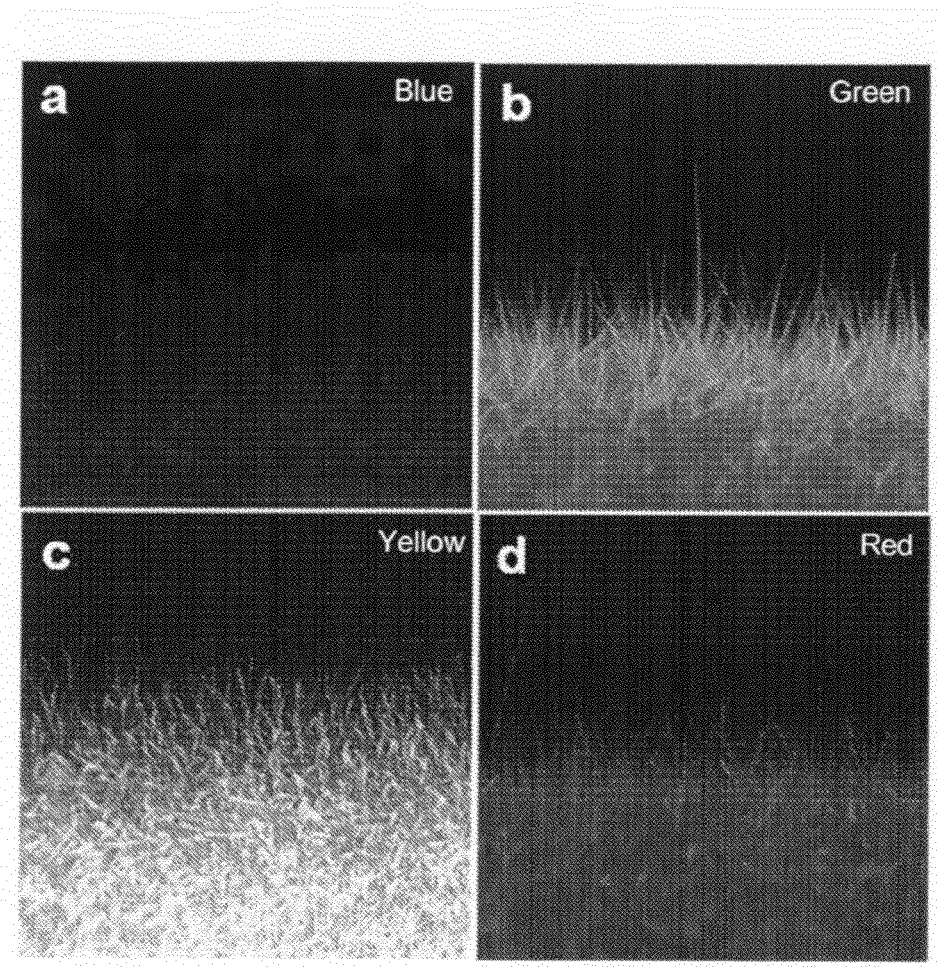
FIG. 15 shows the digital images of (a) blue, (b) green, (c) yellow, and (d) red luminescent barium europium aluminate nanobelts taken under a digital optical microscope with a 365 nm ultraviolet lamp irradiation.

FIG. 15 shows the digital images of (a) blue, (b) green, (c) yellow, and (d) red luminescent barium europium aluminate nanobelts taken under a digital optical microscope with a 365 nm ultraviolet lamp irradiation.

Figure 16:
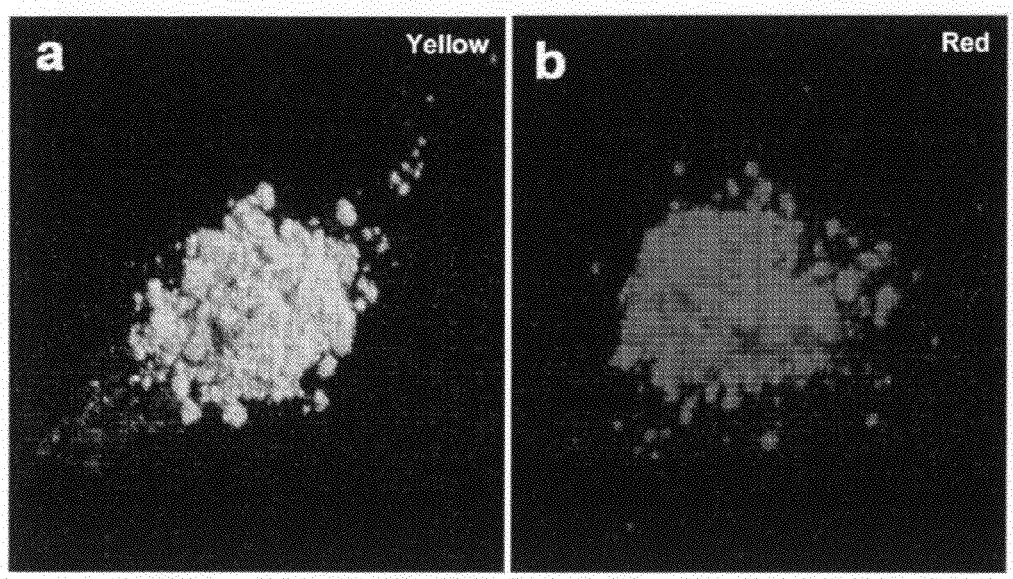
FIG. 16 shows the digital images of (a) yellow and (b) red luminescent barium europium aluminate powders taken under a digital optical microscope with a 365 nm ultraviolet lamp irradiation.

FIG. 16 shows the digital images of (a) yellow and (b) red luminescent barium europium aluminate powders taken under a digital optical microscope with a 365 nm ultraviolet lamp irradiation.

Figure 17:
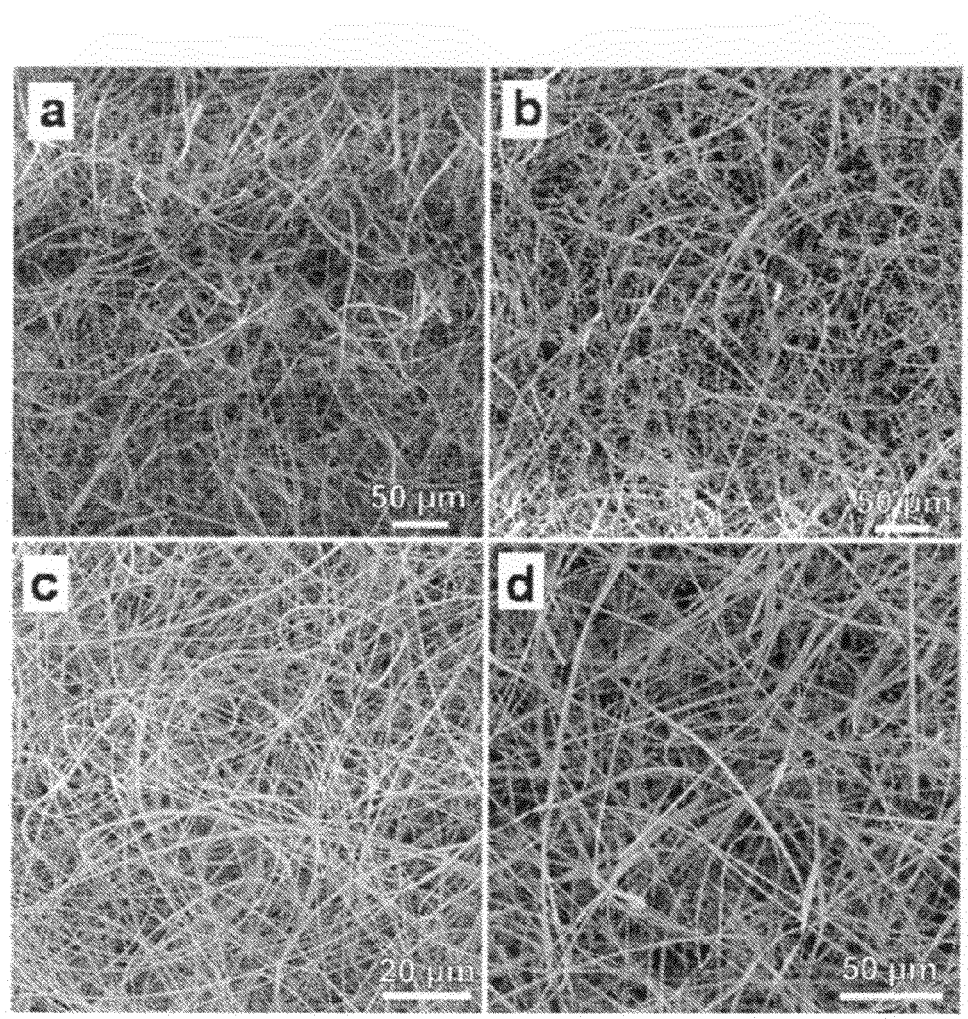
FIG. 17 shows the scanning electron microscope images of (a) blue, (b) green, (c) yellow, and (d) red luminescent, barium europium aluminate nanobelts.

FIG. 17 shows the scanning electron microscope images of (a) blue, (b) green, (c) yellow, and (d) red luminescent barium europium aluminate nanobelts. The nanobelts have widths of about 200 to 600 nanometers, thicknesses of about 50 to 300 nm, and lengths of about 10 μm to 2 mm.

Quantitative composition analyses using a energy-dispersive X-ray spectroscope (EDS) show that the compositions of the BEAO phosphors can be represented by $(Ba_zEu_{1-z}O)_x(Al_2O_3)_y$, wherein z is either 0.75 (for blue and red luminescent BEAO) or 0.99 (for green and yellow luminescent BEAO), and the x and y values vary for different luminescence color products. For the blue luminescent BEAO, z=0.75, x=1, and y=3; accordingly, the composition of the blue luminescent BEAO is $(Ba_{0.75}Eu_{0.25}O)(Al_2O_3)_3$, i.e., $Ba_{0.75}Eu_{0.25}Al_6O_{10}$. For the green luminescent BEAO, z=0.99, x=1, and y=1; accordingly, the composition of the green luminescent BEAO is $(Ba_{0.99}Eu_{0.01}O)(Al_2O_3)$, i.e., $Ba_{0.99}Eu_{0.01}Al_2O_4$. For the yellow luminescent BEAO (including nanobelts and powders), z=0.99, x=4, and y=5; accordingly, the composition of the yellow luminescent BEAO is $(Ba_{0.99}Eu_{0.01}O)_4(Al_2O_3)_5$, i.e., $Ba_{3.96}Eu_{0.04}Al_{10}O_{19}$. For the red luminescent BEAO (including nanobelts and powders), z=0.75, x=4, and y=5; accordingly, the composition of the yellow luminescent BEAO is $(Ba_{0.75}Eu_{0.25}O)_4(Al_2O_3)_5$, i.e., $Ba_3EuAl_{10}O_{19}$.

Figure 18:
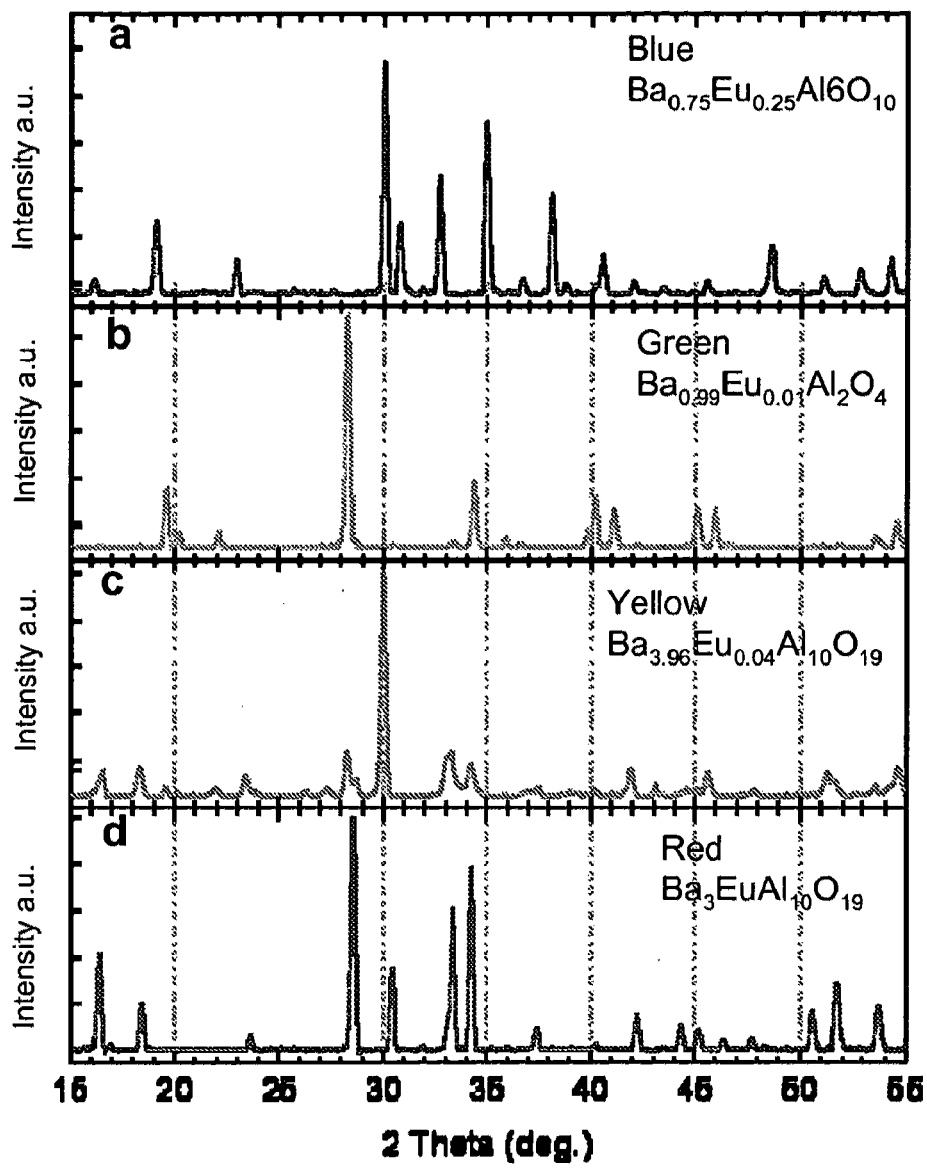
FIG. 18 shows the X-ray diffraction patterns of (a) blue luminescent $Ba_{0.75}Eu_{0.25}Al_6O_{10}$, (b) green luminescent $Ba_{0.99}Eu_{0.01}Al_2O_4$, (c) yellow luminescent $Ba_{3.96}Eu_{0.04}Al_{10}O_{19}$, and (d) red luminescent $Ba_3EuAl_{10}O_{19}$ nanobelts and powders.

FIG. 18 shows the X-ray diffraction patterns of (a) blue luminescent $Ba_{0.75}Eu_{0.25}Al_6O_{10}$, (b) green luminescent $Ba_{0.99}Eu_{0.01}Al_2O_4$, (c) yellow luminescent $Ba_{3.96}Eu_{0.04}Al_{10}O_{19}$ (including nanobelts and powders), and (d) red luminescent $Ba_3EuAl_{10}O_{19}$ (including nanobelts and powders). The green luminescent $Ba_{0.99}Eu_{0.01}Al_2O_4$ can be indexed as hexagonal BaAl$_2$O$_4$ (PDF #72-387). However, no corresponding isostructural phases are available for the blue luminescent $Ba_{0.75}Eu_{0.25}Al_6O_{10}$, yellow luminescent $Ba_{3.96}Eu_{0.04}Al_{10}O_{19}$, and red luminescent $Ba_3EuAl_{10}O_{19}$ in the ICDD database and other commonly available database.

Complementary structural analyses using regular X-ray diffraction, synchrotron X-ray microdiffraction, high-resolution transmission electron microscopy, and electron diffraction show that the blue luminescent $Ba_{0.75}Eu_{0.25}Al_6O_{10}$, yellow low luminescent $Ba_{3.96}Eu_{0.04}Al_{10}O_{19}$, and red luminescent $Ba_3EuAl_{10}O_{19}$ nanobelts have, respectively, tetragonal, hexagonal, and hexagonal crystal structures with new lattice parameters.

The BEAO phosphors can be effectively excited by a wide range of wavelengths ranging from blue light to ultraviolet, X-ray, and to e-beam, and emit intense characteristic blue, green, yellow, and red lights of Eu$^{2+}$ ions.

Figure 19:
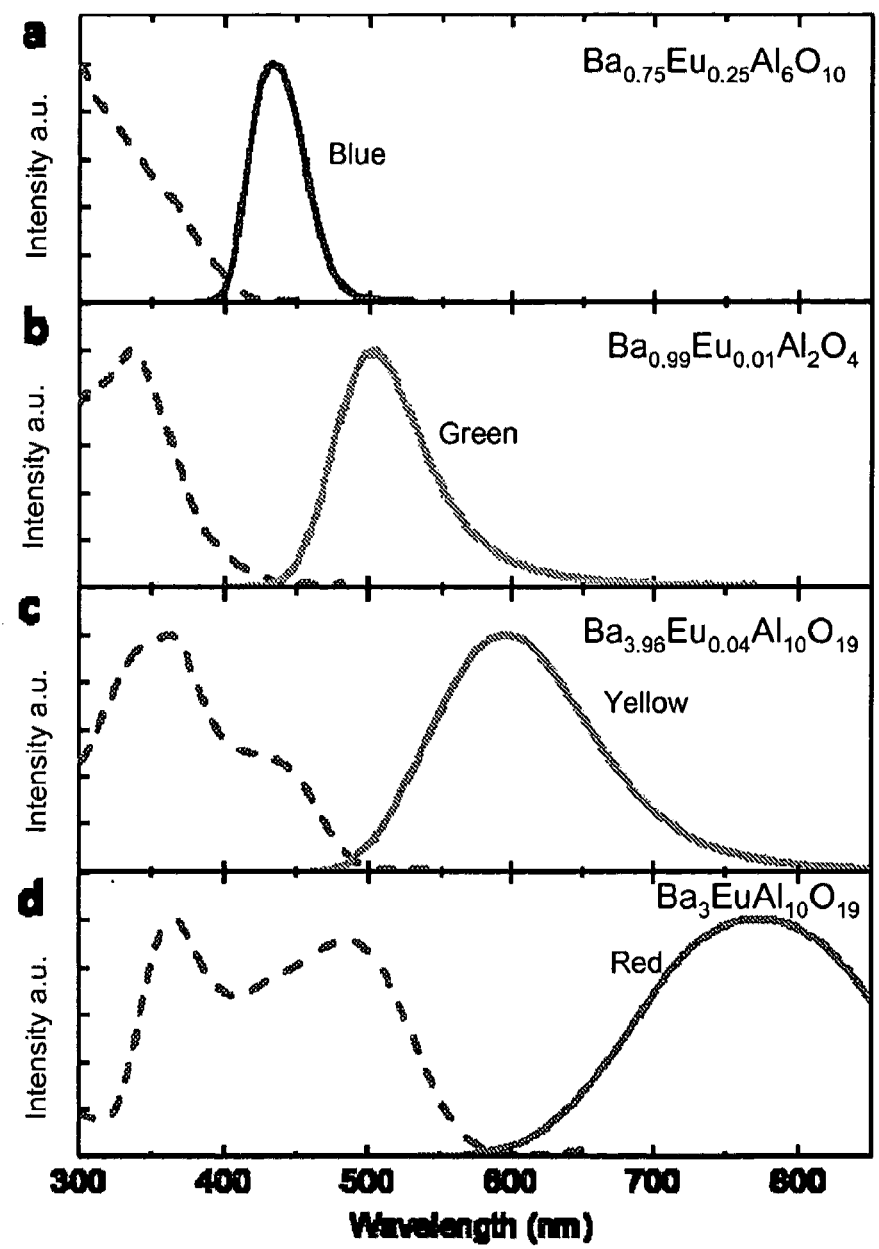
FIG. 19 shows the room-temperature excitation and emission spectra of (a) blue luminescent $Ba_{0.75}Eu_{0.25}Al_6O_{10}$, (b) green luminescent $Ba_{0.99}Eu_{0.01}Al_2O_4$, (c) yellow luminescent $Ba_{3.96}Eu_{0.04}Al_{10}O_{19}$, and (d) red luminescent $Ba_3EuAl_{10}O_{19}$ nanobelts and powders.

FIG. 19 shows the room-temperature excitation and emission spectra of (a) blue luminescent $Ba_{0.75}Eu_{0.25}Al_6O_{10}$, (b) green luminescent $Ba_{0.99}Eu_{0.01}Al_2O_4$, (c) yellow luminescent $Ba_{3.96}Eu_{0.04}Al_{10}O_{19}$, and (d) red luminescent $Ba_3EuAl_{10}O_{19}$ nanobelts and powders. The emission spectra (solid line) are excited by 350 nm ultraviolet light. The excitation spectra (dashed line) are monitoring at 430 nm for blue luminescent $Ba_{0.75}Eu_{0.25}Al_6O_{10}$, 500 nm for green luminescent $Ba_{0.99}Eu_{0.01}Al_2O_4$, 580 nm for yellow luminescent $Ba_{3.96}Eu_{0.04}Al_{10}O_{19}$, and 730 nm for red luminescent $Ba_3EuAl_{10}O_{19}$.

Since the emission bands of the blue, green, yellow, and red luminescent BEAO phosphors cover the whole visible region, the mixture of these four aluminates can provide phosphors for white light pc-LEDs. Significantly, because of the wide emission band of the yellow luminescent $Ba_{3.96}Eu_{0.04}Al_{10}O_{19}$ (e.g., about 500 nm to 700 nm), exciting the yellow luminescent $Ba_{3.96}Eu_{0.04}Al_{10}O_{19}$ alone with a 470 nm blue LED can generate warm white light with CCT<4000 K and CRI>80, which is suitable for indoor illumination.

Figure 20:
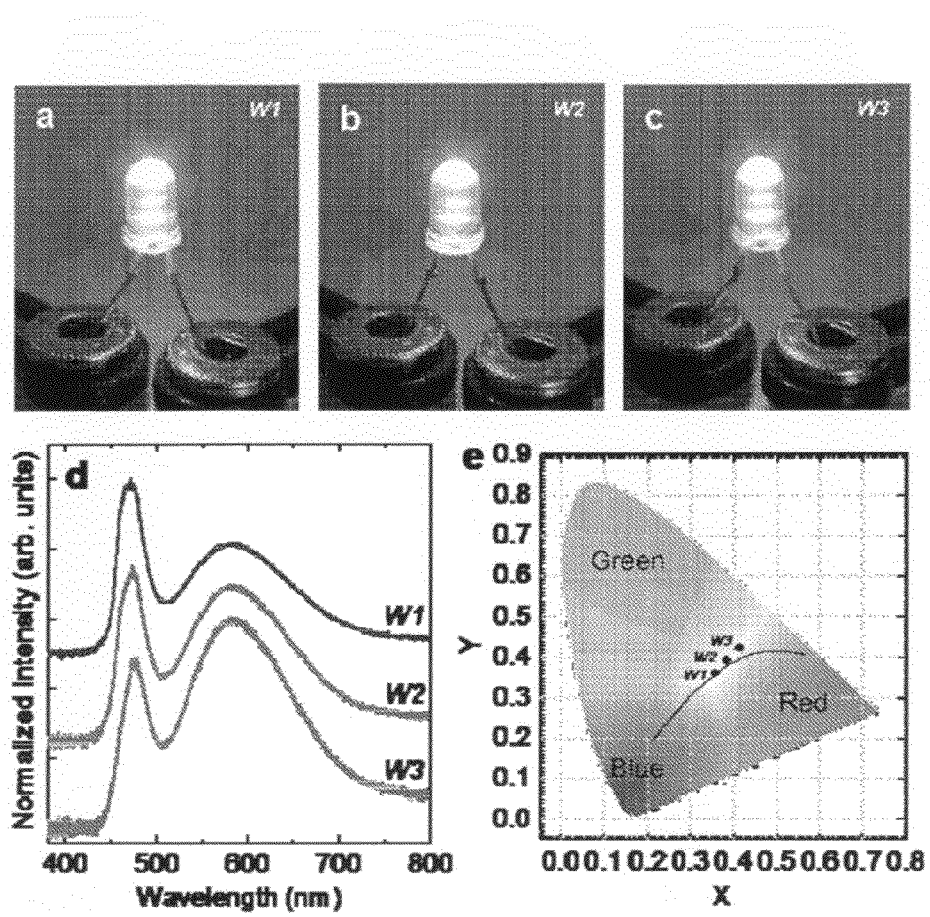
FIG. 20 illustrates prototype white LED packages.

FIGS. 20a-c show three prototype white LED packages, labeled as W1, W2 and W3, which were fabricated by encapsulating InGaN blue LED chip ($\lambda_{max}$=470 nm) with a layer of $Ba_{3.96}Eu_{0.04}Al_{10}O_{19}$. The color qualities of the three white LED packages were tuned by adjusting the thickness of $Ba_{3.96}Eu_{0.04}Al_{10}O_{19}$ layer. The as-fabricated white LED packages emit bright white light under forward bias current of 20 mA. The white light gets warmer from W1 to W3. FIG. 20d shows the emission spectra of the three white LED packages. The spectra were normalized at 470 nm and were offset along y-axis for clarity. For each spectrum, two emission bands were clearly resolved at 470 nm and 580 nm, corresponding to the emission peaks of blue LED chip and $Ba_{3.96}Eu_{0.04}Al_{10}O_{19}$, respectively. The relative intensity of yellow emission band increases with the $Ba_{3.96}Eu_{0.04}Al_{10}O_{19}$ layer thickness from W1 to W3, which results in white light with different color qualities. FIG. 20e shows the chromaticity coordinates of the three white lights on Commission Internationale de l'Eclairage (CIE). The three dots indicate the color points of the three white LED packages. The solid curve is the Planckian locus. The white light from W1 is located at (0.359, 0.359) with CCT=4500 K and CRI=81. The white light from W2 is located at (0.388, 0.389) with CCT=3900 K and CRI=82. The white light from W3 is located at (0.415, 0.423) with CCT=3500 K and CRI=78. The color quality of W2 perfectly meets the demand for indoor illumination.

The complete disclosures of the patents, patent documents, and publications cited herein are incorporated by reference in their entirety as if each were individually incorporated. Various modifications and alterations to embodiments of this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

What is claimed is:

1. A method of making a phosphor nanobelt, comprising:
   mixing an amount of each of $Eu_2O_3$ and $Al_2O_3$ with an amount of either of SrO or BaO, ground with an amount of graphite powder to form a mixture; and
   heating the mixture to about 1350-1550° C. for about 1-3 hours under about 1-50 Torr of flowing argon to form a phosphor nanobelt.

2. A method of making a phosphor whisker, comprising:
   mixing an amount of each of $Eu_2O_3$ and $Al_2O_3$ with an amount of either of SrO or BaO, ground with an amount of graphite powder and a catalyst selected from the group consisting of: $Fe_2O_3$, NiO, $SiO_2$, and $GeO_2$, to form a mixture; and
   heating the mixture to about 1350-1550° C. for about 1-3 hours under about 1-50 Torr of flowing argon to form a phosphor whisker.

3. A method of making a phosphor powder, comprising:
   mixing an amount of each of $Eu_2O_3$ and $Al_2O_3$ with an amount of either of SrO or BaO, ground with an amount of graphite powder to form a mixture; and
   heating the mixture alongside an amount of $Al_2O_3$ powder, to about 1350-1550° C. for about 1-3 hours under about 1-50 Torr of flowing argon to form a phosphor powder.

4. A europium aluminate phosphor comprising:
   a material including a phosphor selected from the group consisting of: a phosphor having the formula $(EuO)(Al_2O_3)_3$, a phosphor having the formula $(Sr_{0.9}Eu_{0.1}O)_4(Al_2O_3)_5$, a phosphor having the formula $(Ba_{0.99}Eu_{0.01}O)_4(Al_2O_3)_5$, and a phosphor having the formula $(Ba_{0.75}Eu_{0.25}O)_4(Al_2O_3)_5$.

5. The phosphor of claim 4, wherein when the phosphor is $(EuO)(Al_2O_3)_3$, the phosphor has the characteristic that it emits intense blue light under excitation.

6. The phosphor of claim 5, wherein the phosphor has a tetragonal crystal structure.

7. The phosphor of claim 4, wherein when the phosphor is $(EuO)_4(Al_2O_3)_5$, the phosphor has the characteristic that it emits intense and broad orange light under excitation.

8. The phosphor of claim 7, wherein the phosphor has a hexagonal crystal structure.

9. The phosphor of claim 4, wherein when the phosphor is $(Sr_{0.9}Eu_{0.1}O)_4(Al_2O_3)_5$, the phosphor has the characteristic that it emits intense and broad yellow light under excitation.

10. The phosphor of claim 9, wherein the phosphor has a hexagonal crystal structure.

11. The phosphor of claim 4, wherein when the phosphor is $(Ba_{0.99}Eu_{0.01}O)_4(Al_2O_3)_5$, the phosphor has the characteristic that it emits intense and broad yellow light under excitation.

12. The phosphor of claim 11, wherein the phosphor has a hexagonal crystal structure.

13. The phosphor of claim 4, wherein the phosphor emits a white light when excited by a 430-480 nm blue LED.

14. The phosphor of claim 4, wherein when the phosphor is $(Ba_{0.75}Eu_{0.25}O)_4(Al_2O_3)_5$, the phosphor has the characteristic that it emits intense and broad red light under excitation.

15. The phosphor of claim 14, wherein the phosphor has a hexagonal crystal structure.

* * * * *